(12) United States Patent
Azzouz et al.

(10) Patent No.: US 12,132,185 B2
(45) Date of Patent: Oct. 29, 2024

(54) DEVICE FOR REGULATING THE TEMPERATURE OF AN ELECTRONIC COMPONENT

(71) Applicant: Valeo Systemes Thermiques, Le Mesnil Saint Denis (FR)

(72) Inventors: Kamel Azzouz, Le Mesnil Saint Denis (FR); Sébastien Garnier, Le Mesnil Saint Denis (FR); Amrid Mammeri, Le Mesnil Saint Denis (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 686 days.

(21) Appl. No.: 17/293,709

(22) PCT Filed: Sep. 10, 2019

(86) PCT No.: PCT/FR2019/052094
§ 371 (c)(1),
(2) Date: Dec. 1, 2021

(87) PCT Pub. No.: WO2020/099738
PCT Pub. Date: May 22, 2020

(65) Prior Publication Data
US 2022/0093993 A1 Mar. 24, 2022

(30) Foreign Application Priority Data

Nov. 16, 2018 (FR) ........................................ 1860652
May 15, 2019 (FR) ........................................ 1905091
(Continued)

(51) Int. Cl.
*H01M 10/6568* (2014.01)
*F28D 9/00* (2006.01)
(Continued)

(52) U.S. Cl.
CPC ...... *H01M 10/6568* (2015.04); *F28D 9/0037* (2013.01); *F28F 3/12* (2013.01);
(Continued)

(58) Field of Classification Search
CPC ........... H05K 7/20936; H05K 7/20881; H05K 7/20318; F28D 2021/0063;
(Continued)

(56) References Cited

U.S. PATENT DOCUMENTS

| 5,943,211 A | 8/1999 | Havey et al. |
| 2006/0174643 A1* | 8/2006 | Ostrom ............... F28D 15/0266 62/119 |
| 2018/0145382 A1 | 5/2018 | Harris et al. |

FOREIGN PATENT DOCUMENTS

| CN | 101534627 A | 9/2009 |
| CN | 203279429 U | 11/2013 |

(Continued)

OTHER PUBLICATIONS

International Search Report with Written Opinion in corresponding International Application No. PCT/FR2019/052094, mailed Jan. 28, 2020 (10 pages).
(Continued)

*Primary Examiner* — Schyler S Sanks
(74) *Attorney, Agent, or Firm* — Osha Bergman Watanabe & Burton LLP

(57) ABSTRACT

The invention relates to a device (2) for regulating the temperature of, and especially for cooling, an electrical component (103), especially a battery, the temperature of which must be regulated, said electrical component (103) especially being liable to give off heat during the operation thereof, the temperature-regulating device comprising at least one first circuit (4) configured to allow a heat-transfer fluid to flow; and at least one second circuit (5) configured (Continued)

Figure 20A:
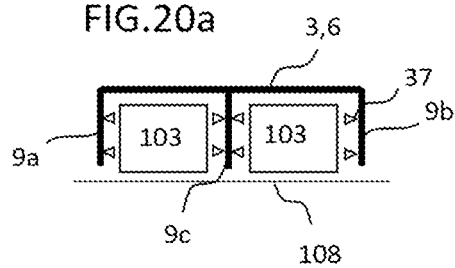

to convey a dielectric fluid, this second circuit comprising at least one outlet for distributing the dielectric fluid in the direction of the electrical component; at least one first circuit (4) and at least one second circuit (5) being arranged so that the first circuit is in a heat-exchange relationship with the fluid distributed via the at least one outlet of the second circuit.

19 Claims, 16 Drawing Sheets

(30) Foreign Application Priority Data

May 15, 2019 (FR) ........................................ 1905092
Jun. 18, 2019 (FR) ........................................ 1906505

(51) Int. Cl.
*F28D 21/00* (2006.01)
*F28F 3/12* (2006.01)
*H01M 10/613* (2014.01)
*H01M 10/625* (2014.01)
*H01M 10/6554* (2014.01)
*H01M 10/6556* (2014.01)
*H01M 10/6569* (2014.01)
*H05K 7/20* (2006.01)

(52) U.S. Cl.
CPC ........ *H01M 10/613* (2015.04); *H01M 10/625* (2015.04); *H01M 10/6554* (2015.04); *H01M 10/6556* (2015.04); *H01M 10/6569* (2015.04); *H05K 7/20318* (2013.01); *H05K 7/20327* (2013.01); *F28D 2021/0029* (2013.01); *F28F 2250/08* (2013.01); *F28F 2275/04* (2013.01); *H01M 2220/20* (2013.01)

(58) Field of Classification Search
CPC ........... F28D 2021/0028; F28D 9/0037; F28D 2021/0029; H01M 10/6555; H01M 10/6554; H01M 10/6568
See application file for complete search history.

(56) References Cited

FOREIGN PATENT DOCUMENTS

FR 3037727 A3 12/2016
FR 3065796 A1 11/2018

OTHER PUBLICATIONS

Office Action issued in counterpart Chinese Patent Application No. CN 201980089325.2 mailed Jan. 1, 2024 (8 pages).

* cited by examiner

[Fig.1]
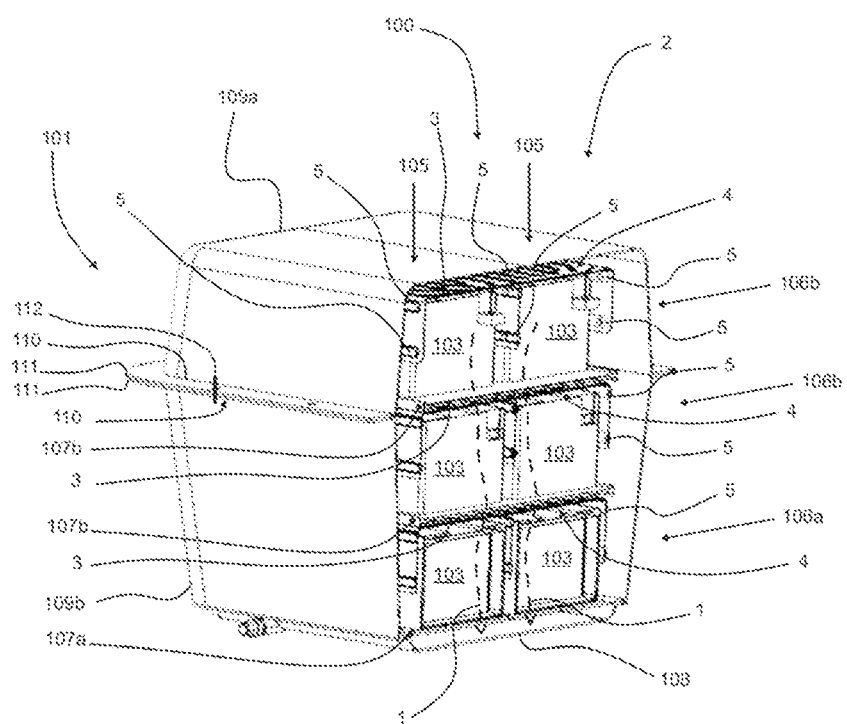

[Fig.2]
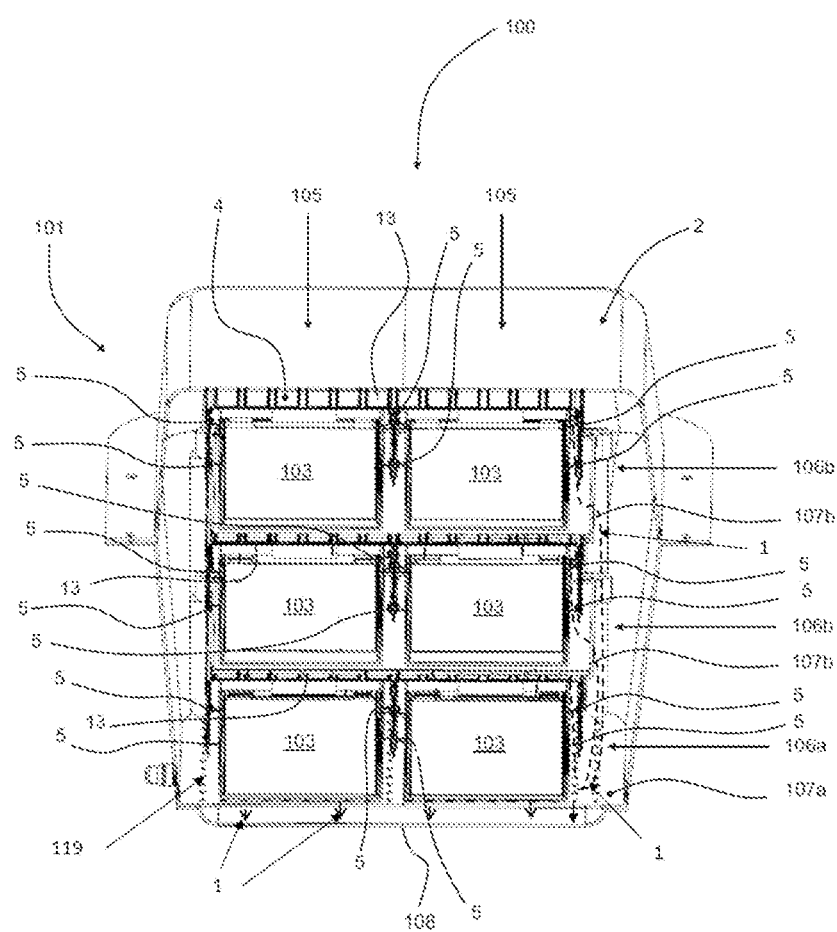

[Fig.3]
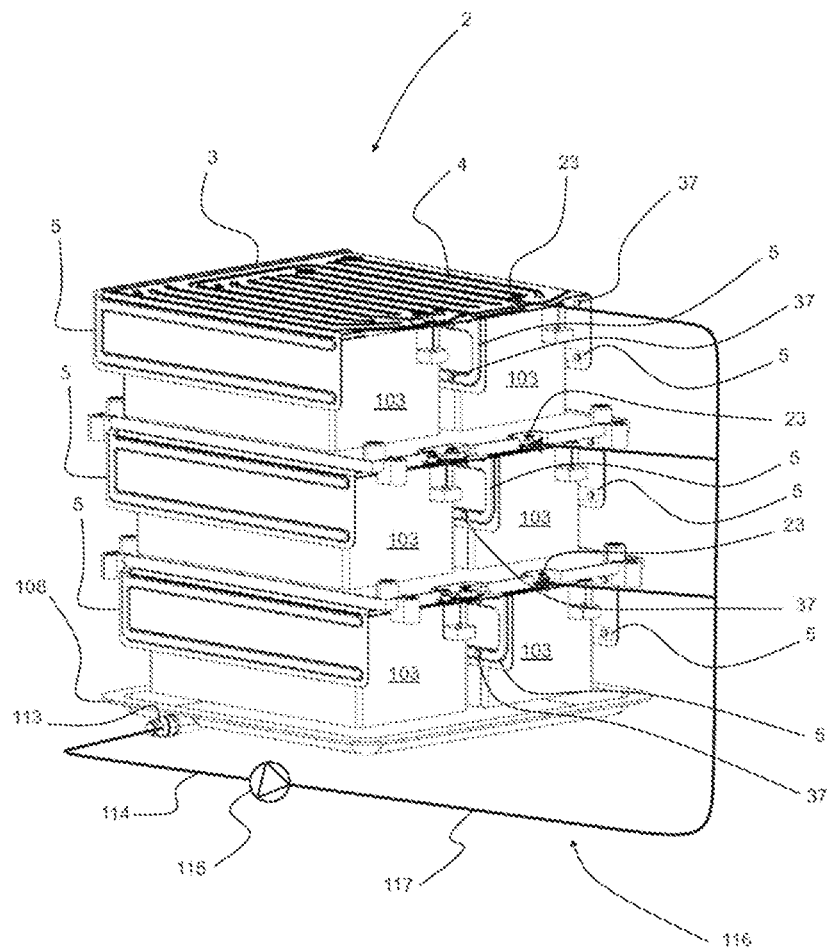
[Fig.4]
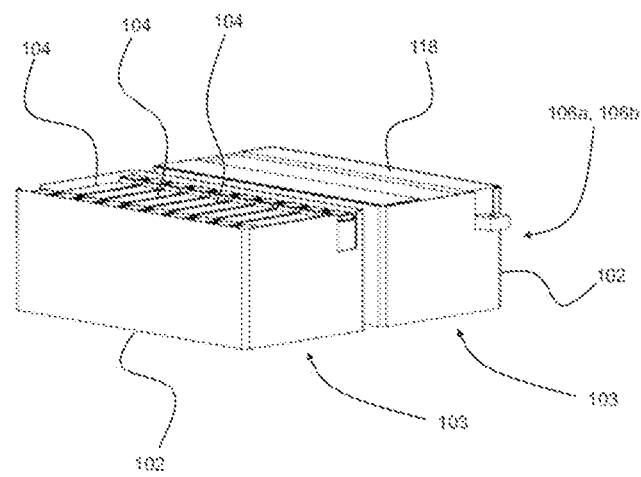

[Fig.5]
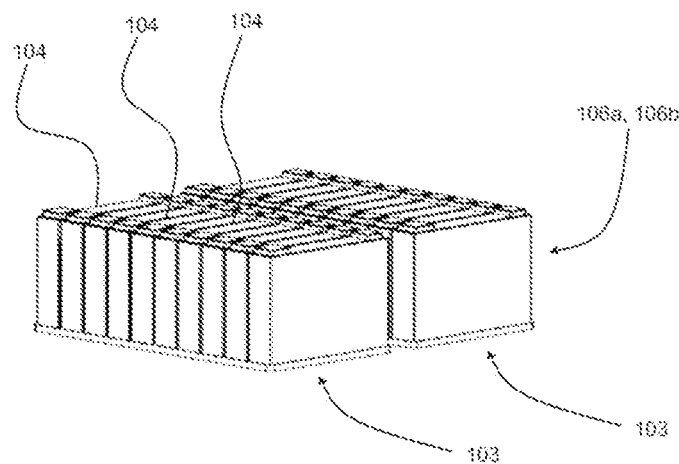
[Fig.6]
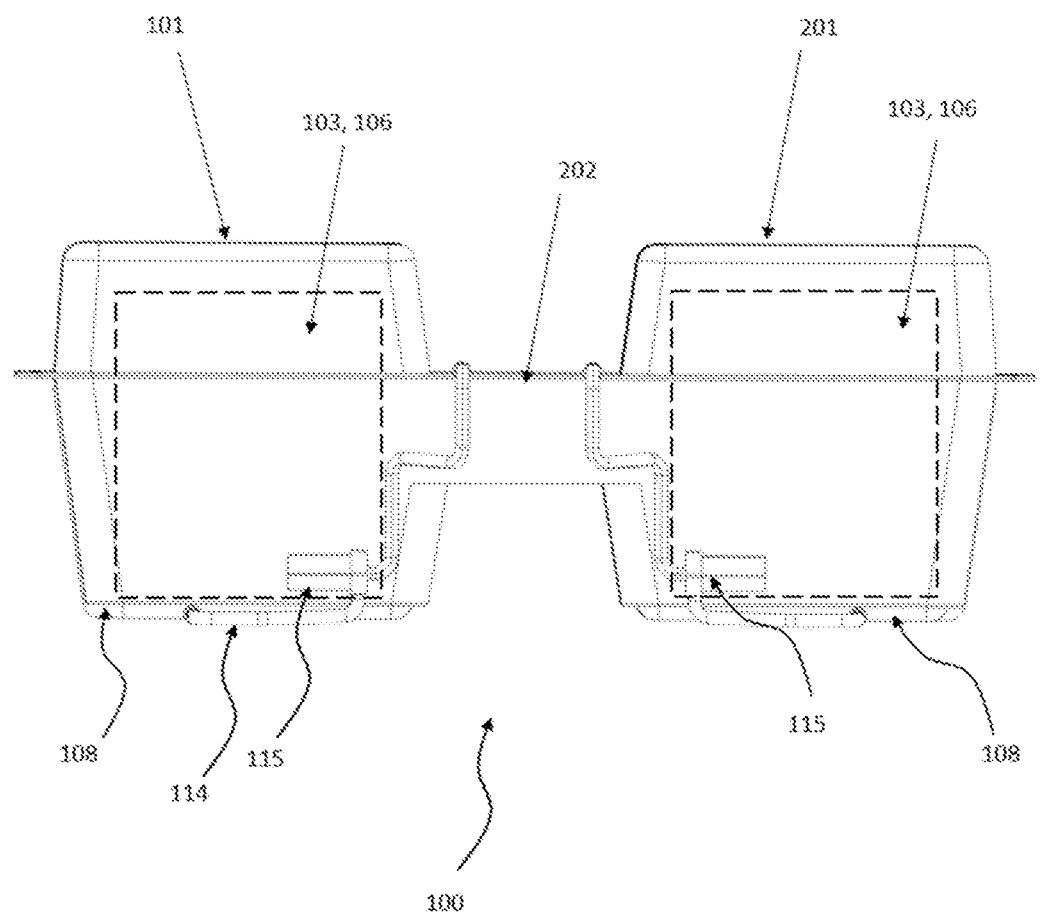

[Fig.7]
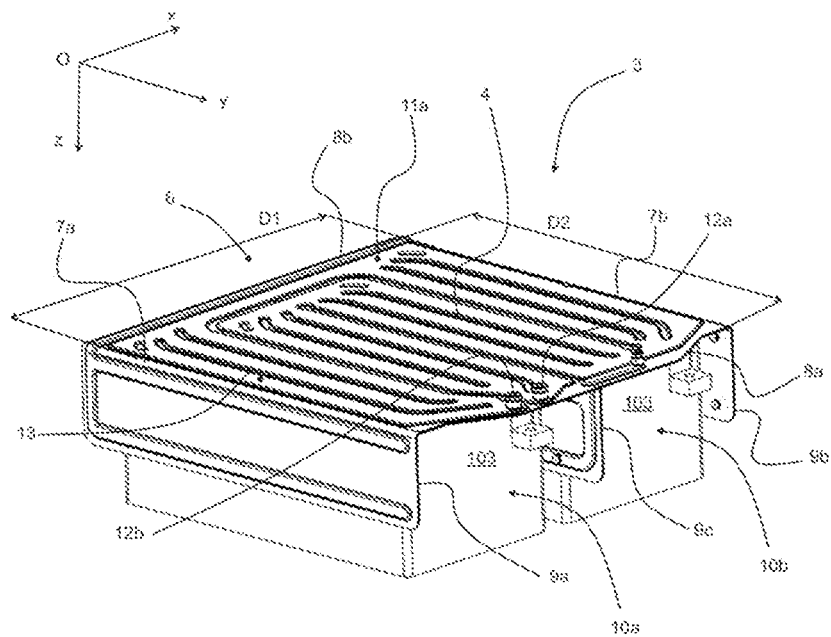
[Fig.8]
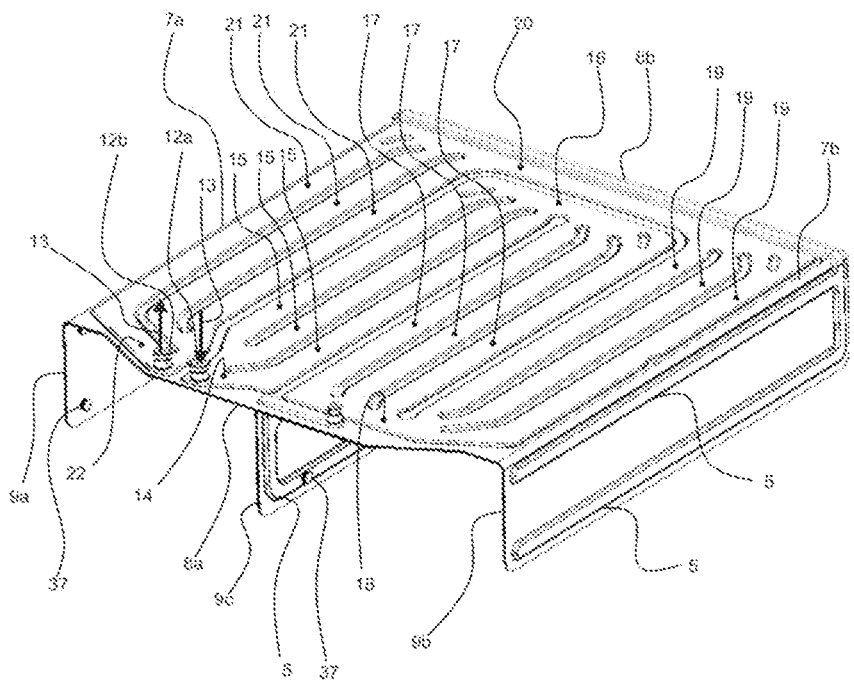

[Fig.9]
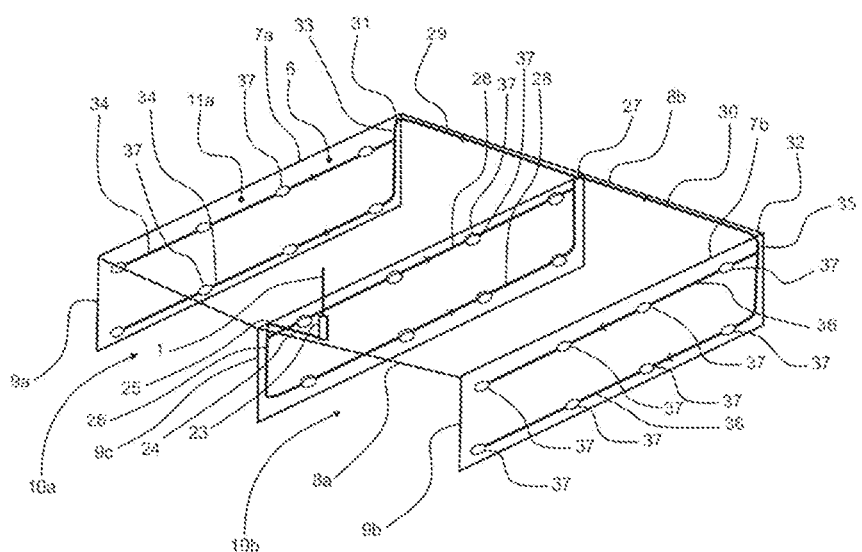

[Fig.10]
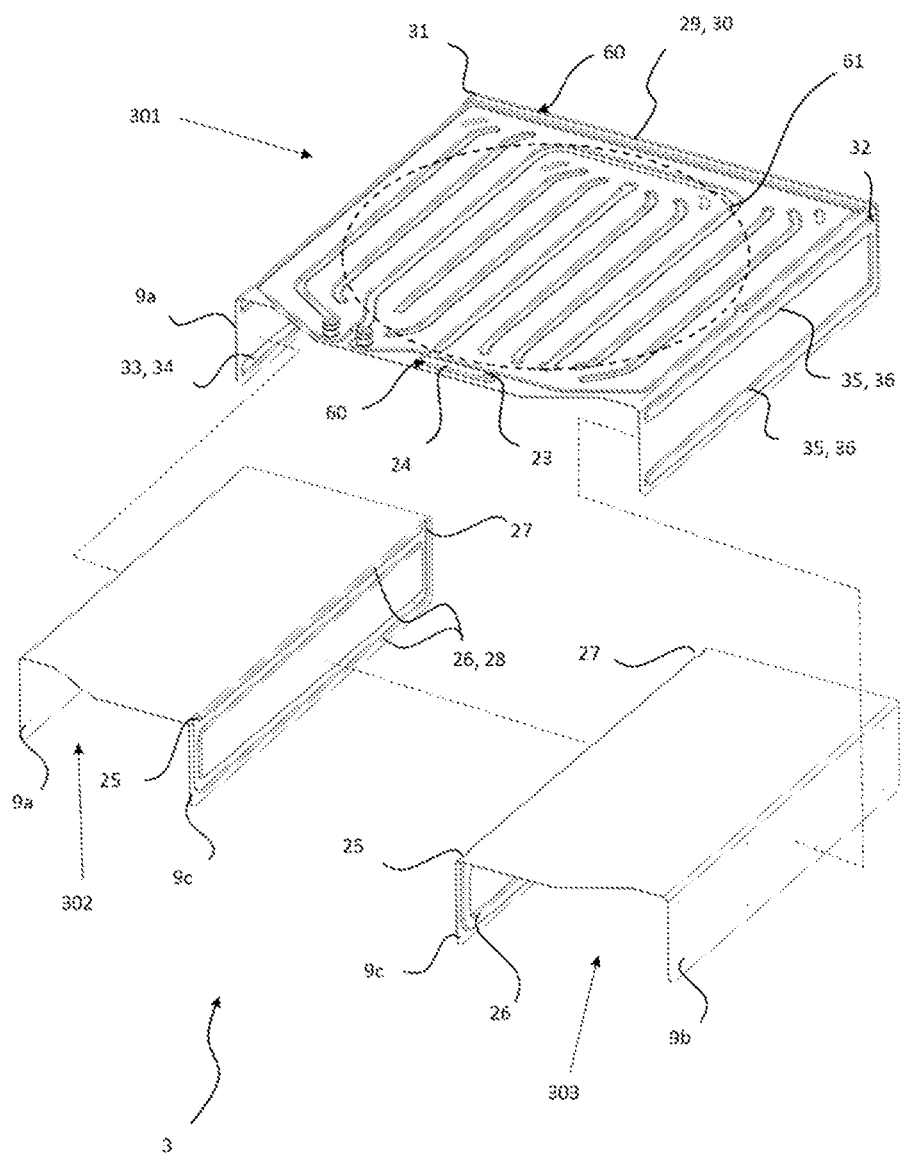

[Fig.11]
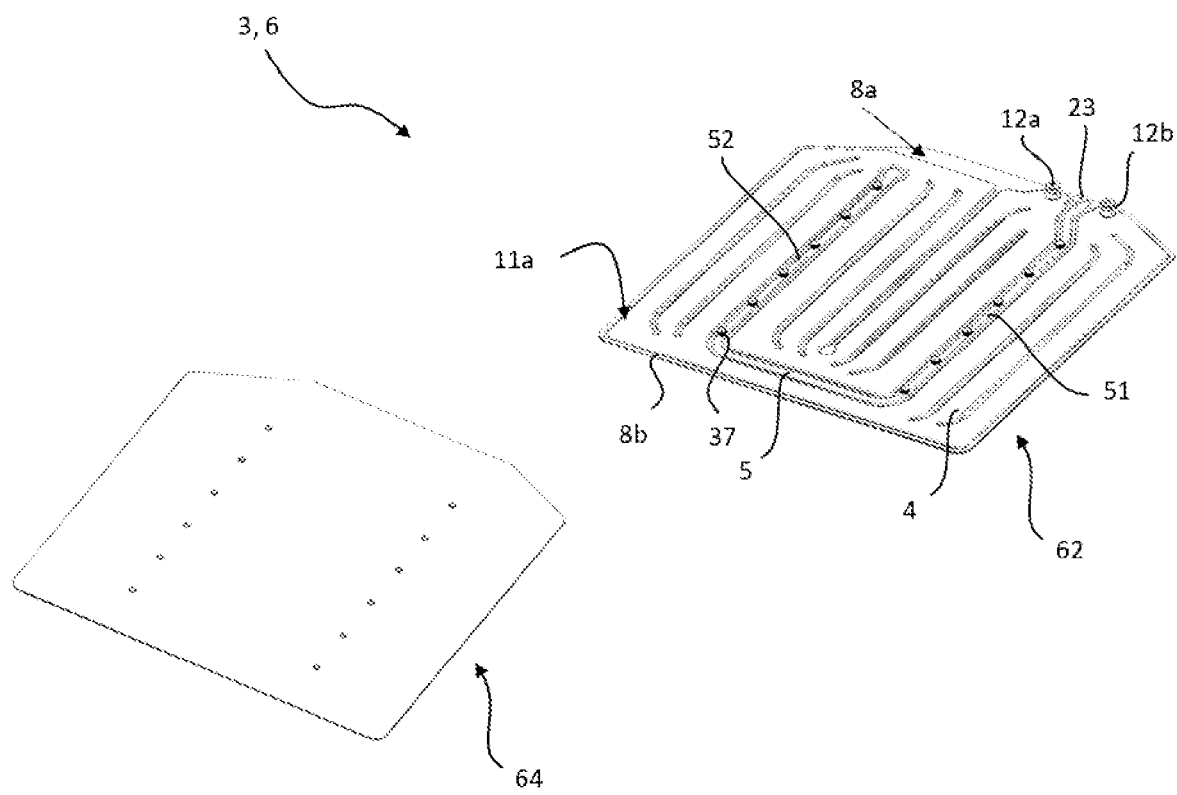

[Fig.12]
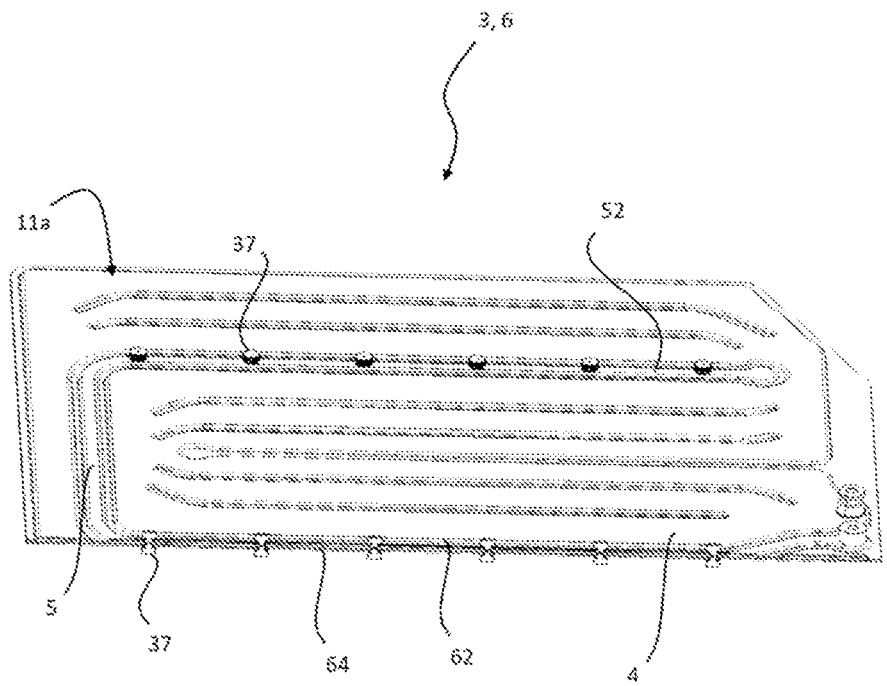
[Fig.13]
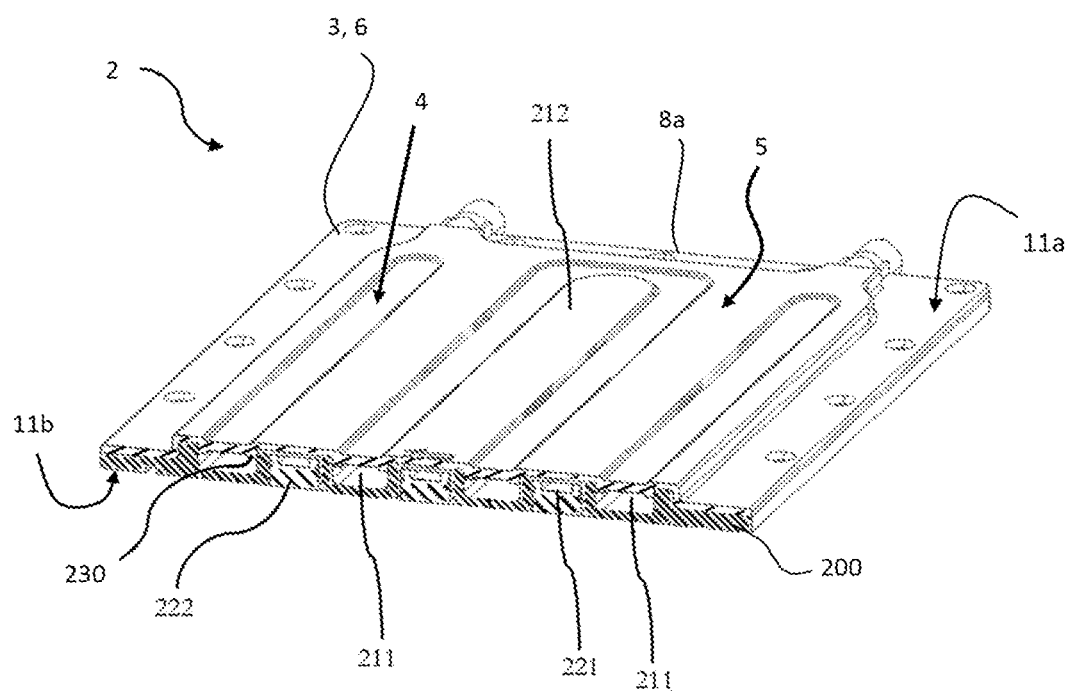

[Fig.14]
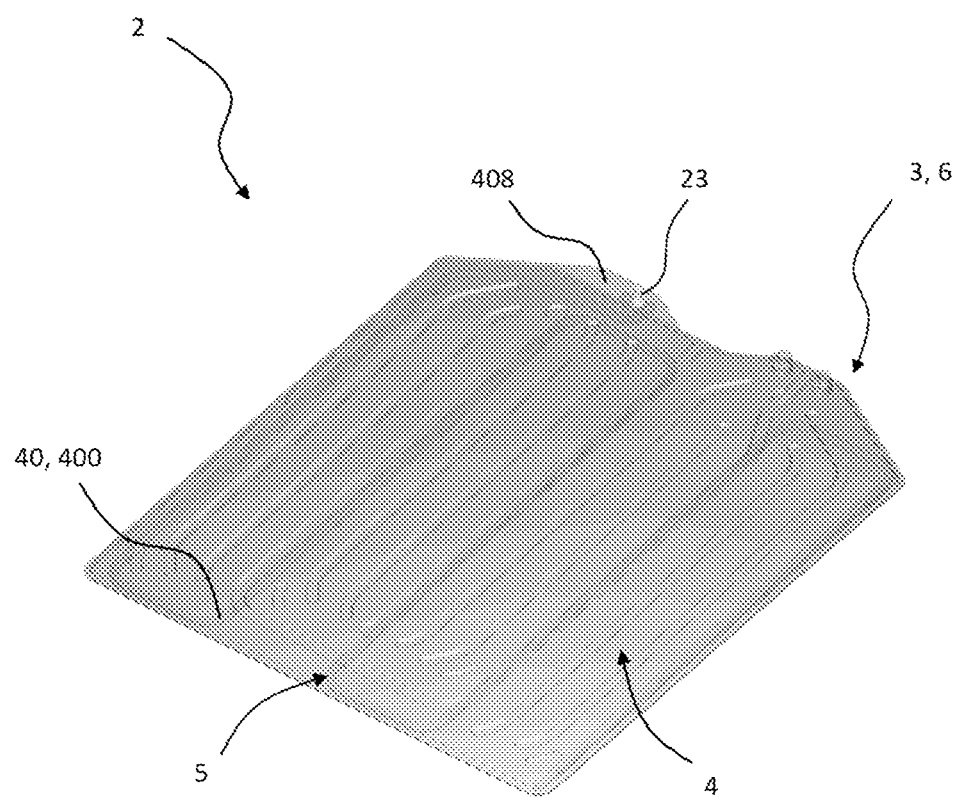

[Fig.15]
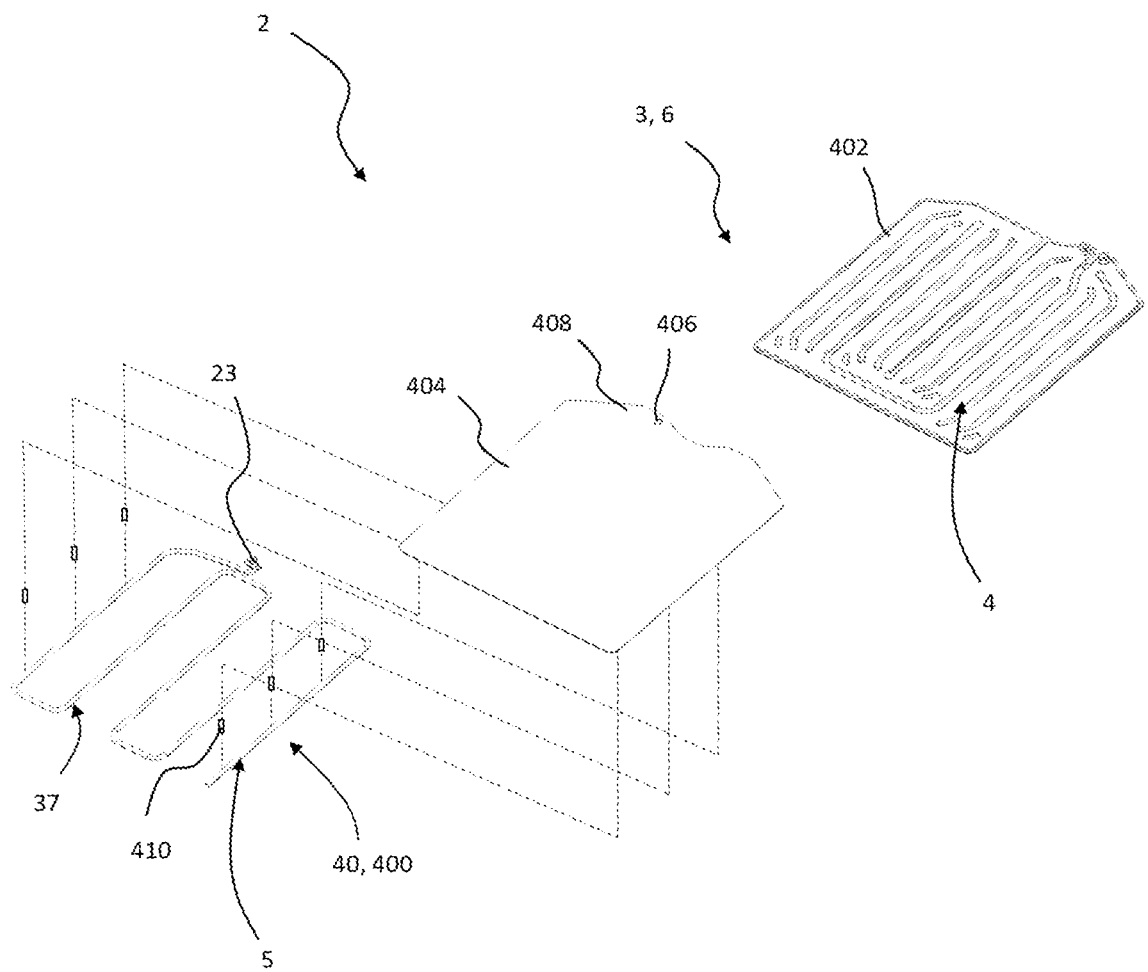

[Fig.16]
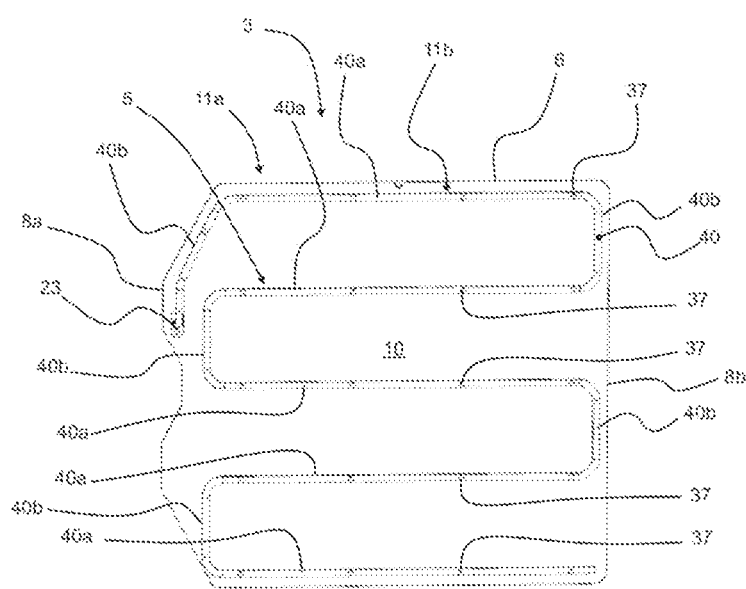

[Fig.17]
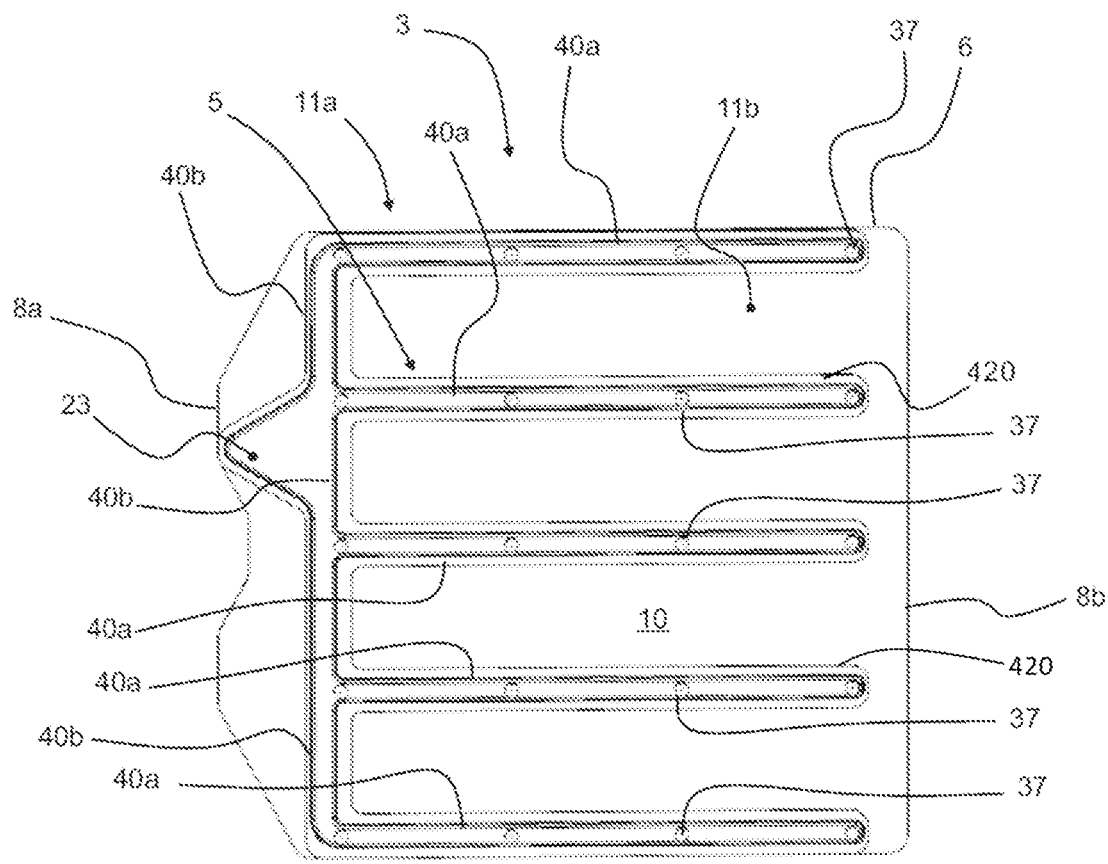

[Fig.18]
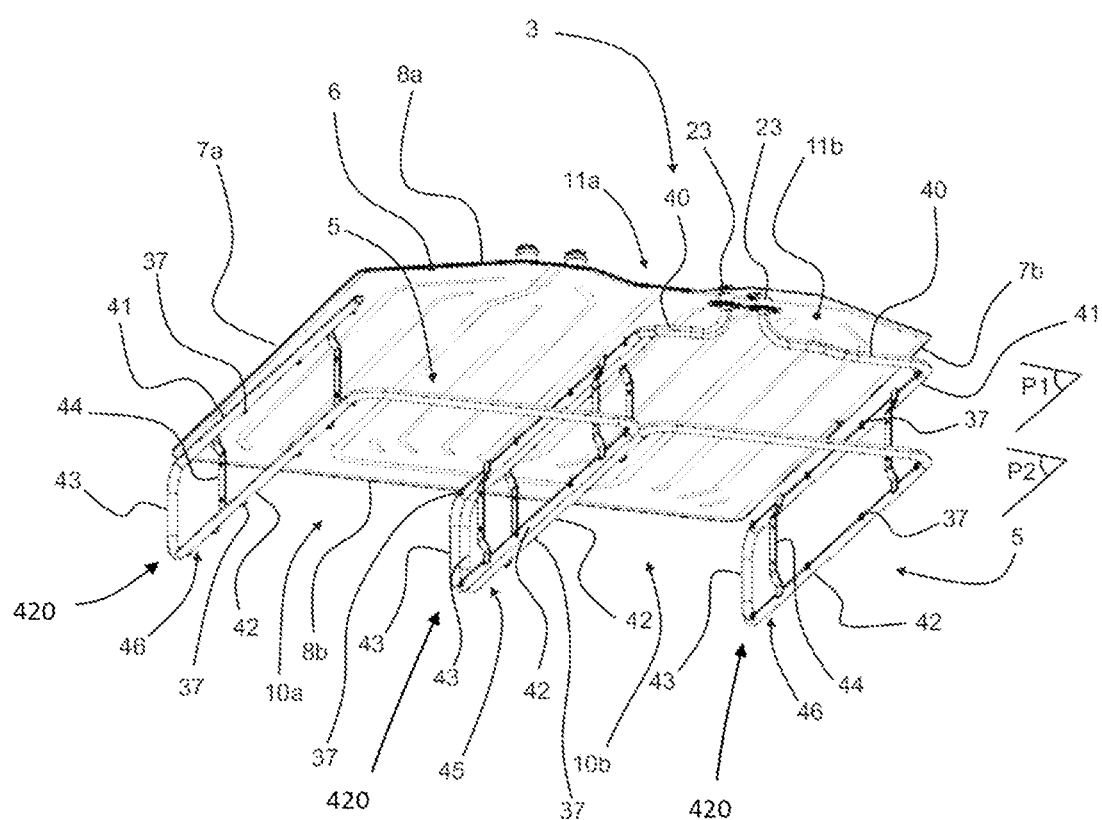

[Fig.19]
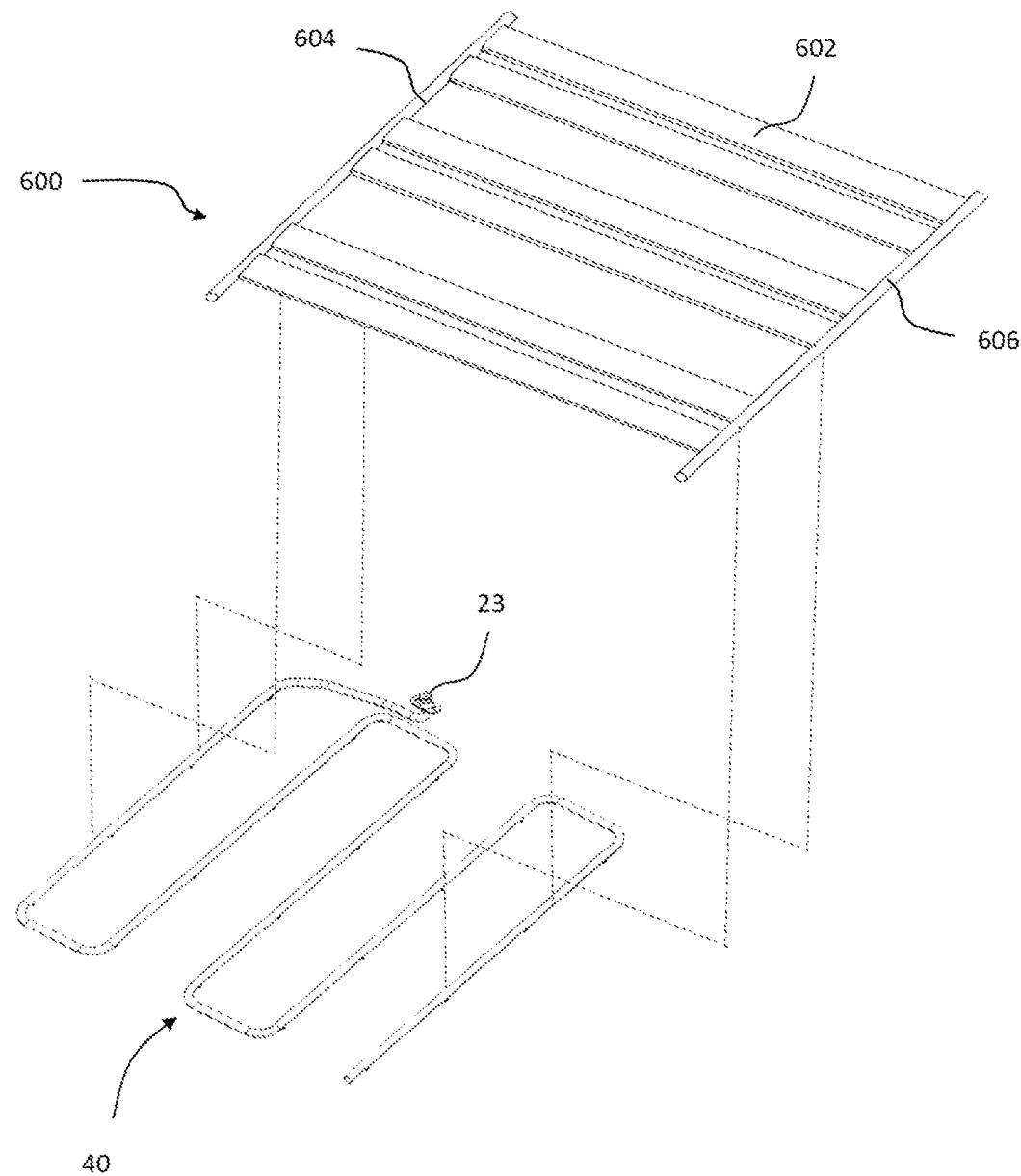

[Fig.20]

DEVICE FOR REGULATING THE TEMPERATURE OF AN ELECTRONIC COMPONENT

The present invention lies within the field of devices for regulating the temperature of electronic components that may give off heat during operation.

Electronic components, regardless of whether they are electrical energy storage cells, integrated circuits, servers, data centers or other items, require temperature regulation to keep them within their operating temperature range.

Data centers around the world currently represent 10% of global power consumption. Because of the advent of blockchain and 5G technologies, this percentage could rise sharply in the next few years. At least half of this power consumption is due to the cooling systems of these data centers. Most data centers are currently air-cooled, using air conditioning devices to cool the ambient air of the storage rooms. The optimal operating temperature for data centers is between 5° C. and 40° C., or more particularly around 27° C. Given that air has a very low conductivity, in order to provide sufficient cooling for electronic components, which may reach temperatures of more than 60° C., the temperature difference between the air and the electronic components to be cooled must be large, and therefore this kind of device is highly energy-intensive and bulky.

In the field of motor vehicles, thermal treatment devices may be used to modify the temperature of an electrical battery, a power circuit device, or an on-board computer, and, notably, to reduce the temperature of a battery, of a power circuit device or of an on-board computer, and notably to reduce the temperature of the battery, which tends to heat up while in use, and particularly while being charged. Such devices for thermal treatment of electrical batteries normally make use of heat exchangers. The various battery cells of a system of electronic components may, notably, be cooled by means of a cold plate inside which a coolant flows, the plate being in contact with the battery cells to be cooled. It has been found that such heat exchangers may cause non-uniform cooling of batteries belonging to the same electricity storage system, resulting in poorer performance of these batteries. These thermal treatment devices also have high thermal resistance, due to the thicknesses of material present between the coolant and the battery cells.

There are some known devices that are intended to respond to these various problems.

Notably, there is a known document FR3037727 which discloses a device for cooling electric or hybrid vehicle batteries. More particularly, this document relates to a device for cooling the cells of batteries in an lithium-ion battery pack. It comprises a hermetically sealed casing in which a two-phase fluid circulates, with a layer of air. The electricity storage cells are partially immersed in the two-phase fluid so that heat is exchanged between the cells and the two-phase fluid. Thus the batteries are cooled by the immersion of the battery cells in said fluid. The reserve stock of two-phase fluid is kept in a tank outside the casing, linked to said casing to allow the circulation of the two-phase fluid.

However, the immersion of electricity storage cells in a fluid, notably a dielectric fluid, does not provide uniform cooling of the cells.

The object of the invention is to offer an alternative means of regulating the temperature of electrical components, notably batteries, while overcoming the aforementioned problems of the prior art, by proposing a temperature regulating device that reduces the temperature of the battery element and makes it uniform, thus optimizing the service life as well as the performance of such a battery element, notably in an electricity storage system for motor vehicles.

In this context, the present invention relates to a device for regulating the temperature of, and notably for cooling, an electronic component, notably a battery, whose temperature has to be regulated, said electronic component being, notably, capable of giving off heat during its operation. The temperature regulating device comprises at least one first circuit configured to allow a heat transfer fluid to flow, at least one second circuit configured to convey a dielectric fluid, this second circuit comprising at least one outlet for distributing the dielectric fluid toward the electronic component, the at least one first circuit and the at least one second circuit being arranged so that the first circuit is in a heat exchange relationship with the fluid distributed via the at least one outlet of the second circuit.

The expression "heat exchange relationship" between the first circuit and the distributed fluid is taken to mean that the first circuit and the heat transfer fluid flowing within this first circuit are intended to exchange heat with the dielectric fluid when the latter has left the second circuit, having performed the action of regulating the temperature of an electronic component. More particularly, this temperature regulating action tends to heat the dielectric fluid, and to vaporize it if appropriate, and the first circuit and the heat transfer fluid exchange heat with this heated dielectric fluid to the extent that they allow its temperature to be reduced by conduction.

The temperature regulating device advantageously has at least one of the following technical characteristics, considered separately or in combination:

the temperature regulating device comprises at least one plate incorporating the at least one first circuit so as to form a condenser capable of liquefying the fluid distributed by the at least one outlet of the second circuit. The mention of a circuit incorporated in a plate is taken to mean that this circuit is arranged in the thickness of the plate, either by means of a configuration with channels formed in the material or a configuration with shells applied against each other to form a wall of the condenser, at least one of the shells being stamped to form a channel of said circuit.

the plate forming a condenser is provided on one of the faces of a heat transfer fluid inlet and a heat transfer fluid outlet between which the first circuit, that is to say the heat transfer fluid circuit, extends.

the second circuit is incorporated into the at least one plate forming a condenser.

the second circuit is incorporated into a plate identical to that incorporating the first circuit.

the second circuit extends in the plate forming a condenser so as to be surrounded by branches forming part of the first circuit.

the second circuit is arranged in a peripheral area of the at least one plate forming a condenser, so as to leave a central area of this plate free for the heat transfer fluid circuit. Thus the condenser can perform its primary function of liquefying the vaporized dielectric fluid after it has been sprayed onto the electronic components, the vaporized fluid possibly being present over the whole surface of the main wall of the condenser configured to be located above the battery element, without this functional condensation surface being perturbed by the passage of a dielectric fluid at a temperature other than that of the heat transfer fluid.

the first circuit and the second circuit are arranged on either side of the plate forming a condenser, which has a plurality of cavities on one side and a plurality of recesses on the other side, said cavities and recesses being covered, respectively, by at least one cover and at least one cap, so that the cavities and recesses form the first and second circuit, respectively.

the second circuit is incorporated into a plate which is secant to that incorporating the first circuit.

the same side of the plate forming a condenser is equipped with the dielectric fluid inlet, the heat transfer fluid inlet and the heat transfer fluid outlet, to facilitate connections to means for supplying the main wall with heat transfer fluid and dielectric fluid.

at least the plate forming a condenser is formed from two separate shells, placed against one another, at least one shell having an embossed area that delimits a cavity forming part of the heat transfer fluid circuit and/or part of the dielectric fluid circuit.

the condenser comprises at least one main wall provided with the dielectric fluid inlet, together with a heat transfer fluid inlet and a heat transfer fluid outlet, between which the heat transfer fluid circuit extends, and at least one secondary wall forming a projection from the main wall.

the condenser further comprises a main wall and a plurality of secondary walls forming a projection from the main wall, including a first secondary wall provided on a first longitudinal end of the main wall, a second, lateral, secondary wall provided on a second longitudinal end of the main wall, and an intermediate secondary wall which is interposed between the lateral secondary walls, the intermediate secondary wall, together with part of the main wall and one of the lateral secondary walls, contributing to delimiting two receiving chambers for an electronic component.

the first circuit is formed in at least the main wall.

the second circuit is formed in at least a secondary wall.

the dielectric fluid circuit comprises a plurality of branches in parallel on each of the secondary walls.

each distribution outlet of the dielectric fluid circuit comprises a spray nozzle, each spray nozzle being directed toward one of the electronic components.

spray nozzles are arranged on each of the opposite faces of the plate forming a condenser.

the second circuit is formed by a pipe constructed separately from the at least one plate forming a condenser and attached to a face of this plate which is turned towards a chamber for receiving at least one electronic component. By making the dielectric fluid circuit separately, it is possible to make the condenser and the heat transfer fluid circuit of different materials and/or in different thicknesses. This may, notably, enable the strength of the dielectric fluid circuit under pressure and the risk of leakage at the condenser to be managed in a different way. Notably, the electric fluid circuit may consist of an aluminum tube attached to the condenser.

if the second circuit is formed by a pipe which is separate from the plate forming a condenser, this second circuit is fixed to the condenser so as to form an integral assembly that may be mounted in one piece in a system of electronic components.

the pipe forming the second circuit has a dielectric fluid inlet end that is fixed to the plate forming a condenser, notably by a brazing operation.

the pipe forming the second circuit is fixed to the plate forming a condenser by means of fixing studs.

the fixing studs are made of a heat-conducting material, advantageously aluminum or steel.

the fixing studs have a main dimension, defining the spacing between the first and the second circuit, of less than 10 mm.

the pipe forming the second circuit is substantially flat in shape, and is arranged in a plane parallel to the plate forming a condenser.

the pipe forming the second circuit has bent portions extending in a plane substantially perpendicular to the plane of the plate forming a condenser.

the main and secondary walls are formed from three U-shaped shells, with a first shell surmounting both a second shell and a third shell arranged side by side, the heat transfer fluid circuit and the dielectric fluid circuit being formed between deformations created on one or other of the shells, respectively.

the first circuit and the second circuit are each formed by a pipe designed to be arranged in the vicinity of the corresponding electronic component.

each battery element comprises at least one electricity storage cell, the electricity storage cell or cells directly facing the walls of the condenser. The spray of dielectric fluid is thus guided directly onto the storage cells, and the cooling by the dielectric fluid may be more effective, at least for the storage cells that directly receive the dielectric fluid, each battery element comprises a second casing housing at least one electricity storage cell, the second casing extending between the storage cell or cells directly and the walls of the condenser. The spray of dielectric fluid is thus guided directly onto the second casing, and the cooling of the storage cells by the dielectric fluid may be more uniform for all the storage cells.

C The invention also relates to a temperature regulating assembly comprising a temperature regulating device such as that described above, configured for regulating the temperature of a plurality of electronic components stacked in a stacking direction, at least one of the electronic components being associated with the at least one first circuit and the at least one second circuit, characterized in that said regulating device comprises a tank for the recovery of the dielectric fluid, arranged in the prolongation of the electronic components in the stacking direction and configured for receiving the dielectric fluid from each condenser, the temperature regulating device comprising means for recirculating the dielectric fluid which are provided with a pump and which connect the recovery tank to the at least one dielectric fluid inlet comprised in each of the second circuits.

The electronic components may be arranged in a superimposition of levels, forming a plurality of levels of electronic components, and each level may comprise one or more electronic components that may give off heat and therefore need to be cooled. Thus the temperature regulating assembly may comprise a plurality of electronic components distributed in a plurality of columns of electronic components and a plurality of levels, each stage of electronic components being provided with at least a first circuit for heat transfer fluid and at least a second circuit for dielectric fluid. Here, the assembly is configured so that a recovery tank is able to receive the dielectric fluid sprayed onto each of the levels of a given set of electronic components, and so that a pump can supply dielectric fluid from the recovery tank to all the dielectric fluid circuits, enabling the given set of electronic components to be sprayed.

Other characteristics and advantages of the invention will also be apparent from the following description on the one hand, and from a number of examples of embodiment provided by way of non-limiting example, with reference to the attached schematic drawings, on the other hand, in which FIG. 1 show a perspective view of a section through a system of electronic components provided with an assembly for regulating the temperature of electronic components according to the present invention, FIG. 2 is a face-on view of the section through the system shown in FIG. 1, FIG. 3 shows a partial perspective view of the system shown in FIGS. 1 and 2, a first casing being, notably, removed to make the temperature regulating assembly readily visible and to schematically illustrate a recirculation pipe and a pump of this temperature regulating assembly, FIG. 4 shows a perspective view of a first variant of electronic components that can be cooled by the temperature regulating assembly shown in FIGS. 1 to 3, FIG. 5 shows a perspective view of a second variant of electronic components that can be cooled by the temperature regulating assembly shown in FIGS. 1 to 3, FIG. 6 shows another example of embodiment of a casing of electronic components comprising two temperature regulating assemblies according to the present invention, FIG. 7 shows a perspective view of a temperature regulating device according to a first embodiment, as provided on the system shown in FIGS. 1 to 3, designed to cool the electronic components shown in FIG. 4 or 5, FIG. 8 shows a perspective view of the temperature regulating device shown in FIG. 7, FIG. 9 shows a schematic view of the temperature regulating device shown in FIGS. 7 and 8, for the purpose of making visible the dielectric fluid circulation channels present in the thickness of a plate forming a condenser of this temperature regulating device, FIG. 10 shows an exploded perspective view of the temperature regulating device shown in FIGS. 7 to 9, FIG. 11 shows a temperature regulating device according to a second embodiment, shown in an exploded view, with a heat transfer fluid circuit and a dielectric fluid circuit formed in the thickness of the same plate forming a condenser, FIG. 12 shows a sectional view of the temperature regulating device of FIG. 11, making visible, notably, the dielectric fluid outlets arranged on either side of the plate forming a condenser, FIG. 13 shows a temperature regulating device according to a third embodiment, shown in section, with the heat transfer fluid and dielectric fluid circuits arranged on either side of the same plate contributing to the formation of a condenser, FIG. 14 shows a temperature regulating device according to a fourth embodiment, with a dielectric fluid circuit formed separately by means of a pipe fixed against, or in the immediate proximity of, the plate forming a condenser, FIG. 15 shows an exploded view of the temperature regulating device of FIG. 14, FIG. 16 shows a view from below of the temperature regulating device of FIG. 14, FIG. 17 shows a variant of the temperature regulating device of FIG. 14, FIG. 18 shows a temperature regulating device according to a fifth embodiment, which differs from the fourth embodiment in the shape of the pipe forming the dielectric fluid circuit, FIG. 19 shows in an exploded view a temperature regulating device according to a sixth embodiment, which differs from the fourth embodiment in the shape of the heat transfer fluid pipe, FIG. 20 shows different possible arrangements of a temperature regulating assembly according to the invention, comprising a temperature regulating device and electronic components to be cooled.

The characteristics, variants and different embodiments of the invention may be associated with each other in different combinations, provided that they are not incompatible or mutually exclusive. Notably, it is possible to envisage variants of the invention comprising only a selection of characteristics described below, in isolation from the other characteristics described, if this selection of characteristics is sufficient to yield a technical advantage or to differentiate the invention from the prior art.

In particular, all the variants and all the embodiments described may be combined with each other, if this combination is not ruled out for technical reasons.

In the figures, elements common to more than one figure retain the same reference.

In FIG. 1, a system of electronic components too, suitable notably for use in a motor vehicle with electric or hybrid propulsion, is illustrated. Such a system too is designed to supply electrical energy to an electric motor fitted to the motor vehicle for the purpose of its propulsion.

According to the invention, the system of electronic components is equipped with a temperature regulating device 2 which comprises at least one first circuit 4 configured to allow the circulation of a heat transfer fluid, and at least one second circuit 5 configured to convey a dielectric fluid, this second circuit comprising at least one outlet for distributing the dielectric fluid toward an electronic component whose temperature has to be regulated, notably because of heating during its operation. The dielectric fluid is caused to capture the heat given off by the electronic component, if necessary by being vaporized by the heat produced by the electronic component to be regulated, and the main function of the heat transfer fluid present in the first circuit is that of recovering the heat from the dielectric fluid. Thus the first circuit is in a heat exchange relationship with the dielectric fluid distributed by the at least one outlet of the second circuit, in order to cool this fluid, and to return it to a liquid state if necessary, so that it can be reinjected into the second circuit and sprayed onto the electronic component again.

Alternatively, the first and second circuits may be in thermal contact; that is to say, they may be close enough together for heat to be exchanged from one circuit to the other, and more particularly from a fluid present in one circuit to another fluid present in the other circuit. Such an arrangement allows the subcooling of the dielectric fluid, if necessary, before it is sprayed onto the electronic components; in other words, it allows a preliminary cooling of the dielectric fluid while it circulates in the liquid phase in the second circuit, thus providing greater efficiency in the desired temperature regulation.

In the illustrated example, the system of electronic components too comprises a first casing 101 that houses a plurality of electronic components, here taking the form of electronic components 103, it being understood that other configurations of the system of electronic components could be used according to the invention, provided that the system comprises a temperature regulating device according to the teachings of the invention.

The first casing 101 comprises two half-shells 109a, 109b, namely a first half-shell 109a and a second half-shell 109b, which are arranged to form a bowl and are joined to each other by means of their edges 110. For this purpose, each edge 110 is provided with a lip 111, the lip 111 of the first shell 109a being fixed to the lip 111 of the second shell 109b by reversible joining means 112 of the screwed or similar type.

The electronic components 103 are parallelepipedal in shape and are arranged relative to one another in a superimposition of levels. More particularly, the electronic components 103 are stacked on each other in a number of columns 105, distributed on a number of levels 106a, 106b. In other words, each level 106a, 106b of electronic components 103 preferably comprises a plurality of electronic components 103 depending on the number of columns 105, given that the number of levels and columns of electronic components varies as a function of the specified overall dimensions of the first casing and as a function of the amount of electrical energy to be stored. Within the same level 106a, 106b of electronic components 103, the latter are arranged side by side, and each level 106a, 106b of electronic components 103 is supported by a platform 107a, 107b on which the electronic components 103 rest.

According to the illustrated example, there are six electronic components 103, distributed in two columns 105 and three levels 106a, 106b, each column 105 comprising three electronic components 103 and each level 106a, 106b comprising two electronic components 103. As specified above, the number of columns 105 and the number of levels 106a, 106b may be different from the illustrated example, notably by being greater.

The electronic components 103 tend to heat up as they are brought into operation. The motor vehicle is therefore equipped with a device 2 for regulating the temperature of the electronic components 103, as mentioned above. Advantageously, the temperature regulating device 2 of the present invention is capable of simultaneously cooling each of the levels 106a, 106b of electronic components 103.

In the example illustrated in FIG. 1, the temperature regulating device 2 associates at least one condenser 3 housing a first circuit 4, more particularly a heat transfer fluid circuit, with a second circuit, more particularly a dielectric fluid circuit 5, which is arranged for spraying a dielectric fluid 1 onto a corresponding level 106a, 106b of electronic components 103. The heat transfer fluid circuit 4 is, notably, designed to cause the dielectric fluid 1, sprayed onto the electronic components 103 and converted to vapor form by the heat given off by the electronic components, to pass from a vapor state to a liquid state.

The heat transfer fluid circuit is thus in a heat exchange relationship with the dielectric fluid after the latter has been sprayed out of the second circuit and vaporized by the heat given off by the electronic components, in the sense that the heat transfer fluid and the corresponding first circuit are configured for exchanging heat with the vaporized dielectric fluid, and notably for transferring cold to this dielectric fluid so that it returns to the liquid state.

The heat transfer fluid may, notably, be a coolant or a refrigerant fluid, and may, for example, be a glycol and water solution, R134a or 1234yf, or CO2, although this list is not definitive.

In the case of the dielectric fluid, this is chosen on the basis of its phase change point. By way of example, the chosen fluid here must have an evaporation temperature at atmospheric pressure of more than 32, 33 or 34 degrees Celsius and a condensation temperature of less than 31, 30 or 29 degrees Celsius.

In other words, the dielectric fluid sprayed in liquid form onto the electronic components of a given level recovers heat given off by these electronic components and is thus converted to vapor. The vapor rises to come into contact with the condenser 3 inside which a heat transfer fluid circulates, and the condenser recovers the heat stored previously by the dielectric fluid, until the latter is liquefied by a heat exchange relationship between the first heat transfer fluid circuit and the dielectric fluid which is then in the gas phase. When it is in liquid form, in droplets, the dielectric fluid falls by gravity into the first casing.

In this first embodiment, the temperature regulating device of the present invention comprises at least as many dielectric fluid circuits 5 as there are levels 106a, 106b of electronic components 103 housed in the first casing 101, and it advantageously comprises as many condensers 3 as there are levels 106a, 106b of electronic components 103 housed in the first casing 101. Additionally, each dielectric fluid circuit 5 is advantageously associated with a corresponding condenser 3 to optimize the condensation of the dielectric fluid 1 and the subsequent cooling of the electronic components 103, level by level, such an association being the most compact possible inside the first casing 101 which delimits the smallest possible confined space.

As is more readily visible in FIG. 2, the first casing 101 comprises a base forming a tank 108 for recovering the dielectric fluid 1 that flows by gravity from a level 106a, 106b of electronic components 103 to a lower level 106a, 106b of electronic components 103. More particularly, the recovery tank is used for recovering dielectric fluid that has been vaporized by each of the condensers. For this purpose, each of the platforms supporting the levels of electronic components is configured for allowing fluid to flow by gravity toward the recovery tank.

Among the platforms 107a, 107b on which respective levels 106a, 106b of electronic components 103 rest, a lower platform 107a, on which a lower level 106a of electronic components 103 rests, may be distinguished. Evidently, the lower level 106a is that of the levels 106a, 106b that are not located above any other level and are therefore the lowest of the levels 106a, 106b of the superimposition of levels of the electronic components 103 described above, with reference to a vertical arrangement and to the direction of gravitational flow of the dielectric fluid in liquid form. Evidently, also, the upper levels 106b of electronic components 103 supported by a corresponding upper platform 107b are located above at least another level 106a, 106b of electronic components 103.

When this distinction has been made, it should be noted that the lower platform 107a is pierced by a plurality of openings 119 allow the dielectric fluid to flow through it toward the recovery tank. The openings 119 are designed to allow an operation of filtering the dielectric fluid before the latter enters the recovery tank. To allow an efficient filtering operation, the lower platform 107a is designed to be in contact around its periphery with the walls delimiting the first casing.

It should also be noted that the upper platforms 107b have a solid, unpierced surface, and that they are designed to form a peripheral passage between the peripheries of the corresponding platform and the walls delimiting the first casing. Evidently, these upper platforms 107b are located above a lower level, and therefore a condenser, and in this example of embodiment it is desirable only for dielectric fluid in liquid form to flow over the upper face of the condenser, that is to say on the face turned toward the upper platform. It should be noted, therefore, that, according to the invention, and as illustrated in broken lines in FIG. 2, the dielectric fluid in liquid form is discharged via the edges of the platform in the upper levels and falls onto the lower platform, the dielectric fluid being capable of flowing into the recovery tank via the openings 119 when this fluid settles on the lower platform 107a.

In a variant which is not shown, provision may be made for each, or at least some, of the upper platforms to be pierced as well, since the condenser above which such a pierced platform is located is arranged so as to be on an inclined plane relative to the plane of the corresponding platform. Consequently, the water flowing through the upper platforms via the piercings cannot settle between the condenser and the corresponding upper platform, and is able to flow to the sides so that it falls by gravity into the recovery tank.

With reference to FIG. 3, the recovery tank 108 is provided with a discharge tube 113 for the dielectric fluid 1 recovered in the recovery tank 108, the discharge tube 113 being in fluid communication with a recirculation pipe 114 for the dielectric fluid 1. The recirculation pipe 114 is equipped with a pump 115 for returning the dielectric fluid 1 to each of the dielectric fluid inlets 23 provided on a condenser. Thus the pump 115, which is common to each level of electronic components of the temperature regulating device 2, is capable of supplying dielectric fluid 1 to all the dielectric fluid 5 circuits comprised in the temperature regulating device 2, which is advantageous in terms of production costs. Evidently, a distributor, not shown in the figure, is capable of supplying dielectric fluid 1 to all the dielectric fluid 5 circuits that are comprised in the temperature regulating device 2, and that are provided in a respective level 106a, 106b of electronic components 103.

As illustrated, it should be noted that the dielectric fluid inlets 23 are all arranged on the same side of each condenser 3, to facilitate the distribution of the dielectric fluid recovered in the common recovery tank in each of the dielectric fluid inlets.

Each dielectric fluid circuit 5 is provided with at least one spray nozzle 37 which is capable of spraying the dielectric fluid 1 in the liquid state toward the electronic components 103 in order to cool them. Thus, evidently, the dielectric fluid 1 flows along a circulation loop 116 comprising the recovery tank 108 for the dielectric fluid 1 in the liquid state, the recirculation pipe 114 for the dielectric fluid 1 equipped with the pump 115 which jointly supplies, via recirculation means 117, each dielectric fluid circuit 5 provided on a level 106a, 106b of electronic components 103, the spray nozzles 37 of the dielectric fluid circuits 5 spraying the electronic components 103 with dielectric fluid 1 which is vaporized in contact with them, and which is then liquefied in contact with the condenser 3 so that it drips by gravity into a common recovery tank 108.

In FIGS. 4 and 5, the electronic component 103 may, notably, be a battery element.

FIG. 4 shows a level 106a, 106b of electronic components 103 according to a first variant embodiment. Each battery element 103 comprises a second casing 102 which houses a plurality of electricity storage cells 104. The second casing 102 comprises a cover 118, which has been removed from one of the second casings 102 to make the electricity storage cells 104 visible. In this first variant embodiment, the dielectric fluid sprayed via the nozzles provided on the dielectric fluid circuit comes into contact with the second casing, and is vaporized by the heat given off by this second casing. The cooling of this second casing causes in a fall in temperature in the enclosure in which the electricity storage cells are housed, and therefore a fall in the temperature of the cells themselves.

FIG. 5 shows a level 106a, 106b of electronic components 103 according to a second variant embodiment. Each battery element 103 comprises only a plurality of electricity storage cells 104. In this second variant embodiment, in which the electricity storage cells are directly facing the condenser, the dielectric fluid sprayed via the nozzles provided on the dielectric fluid circuit comes into direct contact with the electricity storage cells, and is vaporized by the heat given off by each of these cells.

Evidently, each electricity storage cell 104 is the functional unit of the battery element 103 that supplies the electric motor with at least some of the electrical energy that it requires. The electricity storage cell 104 is, for example, a lithium-ion cell or similar.

FIG. 6 shows an example of embodiment of an electrical component casing in which two cooling devices are provided. In accordance with the above description, each temperature regulating device is associated with a portion of the system of electronic components too comprising a casing 101, 201 which houses a plurality of electronic components 103 arranged on levels 106, and each temperature regulating device comprises a recovery tank arranged at the bottom of the corresponding casing for recovering the dielectric fluid originally sprayed onto a plurality of levels of electronic components.

In the illustrated example, a first casing 101 and a second casing 201 are arranged side by side with a connecting portion 202 that has a clearance area to match a specific arrangement of a motor vehicle, although this is not a limiting feature. The example of FIG. 6 is, notably, useful in that it makes it possible to understand that an electrical component casing may comprise a plurality of recovery tanks and a plurality of pumps, with each recovery tank and each associated pump arranged to recover the dielectric fluid sprayed onto a plurality of electronic components stacked on top of each other above the recovery tank in question.

It should be noted that, in the examples of configuration described in FIGS. 1 to 6, the element 103 could also be another type of electronic component, such as a server, and the system of electronic components too could be a system of servers. The nature of the electronic component described in the above example does not limit the scope of the invention.

Different embodiments of a temperature regulating device according to the invention will now be described with reference to FIGS. 7 to 19. The temperature regulating device is, notably, adapted to a configuration such as that described in FIGS. 1 to 6 by way of non-limiting example, and could also be implemented with a single level of electronic components or in any other technically feasible configuration.

FIGS. 7 to 10 show a first embodiment. In FIG. 7, the condenser 3 is shown in an orthonormal reference frame Oxyz comprising a longitudinal axis Ox, a lateral axis Oy and a transverse axis Oz. The condenser 3 comprises a main wall 6 extending in a plane parallel to the plane Oxy. The main wall 6 is arranged substantially in the form of a quadrilateral comprising two longitudinal ends of the main wall 7a, 7b, opposed to each other and arranged at a first distance D1 from each other, and two lateral ends of the main wall 8a, 8b, opposed to each other and arranged at a second distance D2 from each other.

The condenser 3 also comprises three secondary walls 9a, 9b, 9c which extend, respectively, in a plane parallel to the plane Oyz. Among the three secondary walls 9a, 9b, 9c, it is possible to distinguish a first lateral secondary wall 9a provided on a first longitudinal end of the main wall 7a, a second lateral secondary wall 9b provided on a second longitudinal end of the main wall 7b, and an intermediate secondary wall 9c which is interposed between the lateral secondary walls 9a, 9b, while being arranged in this case at an equal distance from the first lateral secondary wall 9a and from the second lateral secondary wall 9b.

The first lateral secondary wall 9a and the intermediate secondary wall 9c, together with a portion of the main wall 6, delimit a first chamber 10a designed to receive a first electronic component 103. The second lateral secondary wall 9b and the intermediate secondary wall 9c, together with another portion of the main wall 6, delimit a second chamber 10b designed to receive a second electronic component 103.

The main wall 6 houses the heat transfer fluid circuit 4 which zigzags inside the main wall 6, above the first chamber 10a and above the second chamber 10b. According to an example of embodiment, the heat transfer fluid circuit 4 is arranged in a thickness of the main wall 6. According to another example of embodiment, the main wall 6 is formed from two shells, placed against each other, at least one shell having an embossed area that delimits a cavity forming part of the heat transfer fluid circuit 4. In this case, the heat transfer fluid circuit 4 is arranged in relief on at least one of the shells.

The main wall 6 comprises a first face 11a, the upper face in FIG. 7, which is provided with a heat transfer fluid inlet 12a and a heat transfer fluid outlet 12b. The heat transfer fluid inlet 12a is provided to allow the admission of a heat transfer fluid 13 into the heat transfer fluid circuit 4, while the heat transfer fluid outlet 12b is provided to allow the discharge of the heat transfer fluid 13 from the heat transfer fluid circuit 4. The heat transfer fluid 13 is, for example, carbon dioxide or similar. Evidently, when the heat transfer fluid 13 circulates inside the first circuit 4, the heat transfer fluid 13 cools the main wall 6 to keep it at a temperature below a condensation temperature of the dielectric fluid 1, thus ensuring that the dielectric fluid 1 changes to the liquid state when it contacts the main wall.

As mentioned above, the heat transfer fluid circuit is thus in a heat exchange relationship with the dielectric fluid distributed as it leaves the second circuit.

As is more readily visible in FIG. 8, the heat transfer fluid inlet 12a and the heat transfer fluid outlet 12b are arranged near a first lateral end of the main wall 8a, and the heat transfer fluid circuit 4 extends from the heat transfer fluid inlet 12a to the heat transfer fluid outlet 12b. The heat transfer fluid circuit 4 comprises, for example, a number of branches for the circulation of the heat transfer fluid 15, 17, 19, 21, which are arranged in parallel with each other. Thus, according to the illustrated example, the heat transfer fluid inlet 12a is in fluid communication with a distributor 14 that supplies three first heat transfer fluid circulation branches 15 that are parallel to each other. These three first heat transfer fluid circulation branches 15 open inside a first manifold 16 which is arranged near a second lateral end of the main wall 8b. Thus, inside the first heat transfer fluid circulation branches 15, the heat transfer fluid 13 substantially travels over the second distance D2, shown in FIG. 7. The first manifold 16 is in fluid communication with three second heat transfer fluid circulation branches 17, which are arranged in parallel with each other. The three second heat transfer fluid circulation branches 17 extend from the first manifold 16 to a second manifold 18 which is arranged near the first lateral end of the main wall 8a. Thus, inside the second heat transfer fluid circulation branches 17, the heat transfer fluid 13 again substantially travels over the second distance D2. The second manifold 18 is in fluid communication with three third heat transfer fluid circulation branches 19, which are arranged in parallel with each other, one of the third heat transfer fluid circulation branches 19 bordering on the second longitudinal end of the main wall 7b. The three third heat transfer fluid circulation branches 19 extend from the second manifold 18 to a third manifold 20 which is arranged near the second lateral end of the main wall 8b, and which extends along the second lateral end of the main wall 8b to the first longitudinal end of the main wall 7a. Thus, inside the third heat transfer fluid circulation branches 19, the heat transfer fluid 13 again substantially travels over the second distance D2. Thus, inside the third manifold 20, the heat transfer fluid 13 substantially travels over the first distance D1, shown in FIG. 7. The third manifold 20 is in fluid communication with three fourth heat transfer fluid circulation branches 21, which are arranged in parallel with each other, one of the fourth heat transfer fluid circulation branches 21 bordering on the first longitudinal end of the main wall 7a. The three fourth heat transfer fluid circulation branches 21 extend from the third manifold 20 to a fourth manifold 22 which is arranged near the heat transfer fluid outlet 12b. Evidently, the number of heat transfer fluid circulation branches 15, 17, 19, 21 arranged between two manifolds 16, 18, 20 or between a manifold 16, 18, 20 and the distributor 14, as well as the number of manifolds 16, 18, 20, may be different from those mentioned above.

Because the heat transfer fluid 13 travels over the second distance D2 and the first distance D1 a number of times, it is possible to cool the whole surface of the main wall 6, and subsequently to cool the dielectric fluid 1 that comes into contact with the main wall 6 after it has vaporized in contact with the electronic components 103.

It should be noted that the main wall and the various heat transfer fluid circulation branches that are formed there are configured so that the heat transfer fluid circuit 4 is arranged in a central area 61 of the main wall 6.

Following the description of the heat transfer fluid circuit 4, the dielectric fluid circuit 5 will now be described. In this first embodiment, the dielectric fluid circuit 5 is formed in the thickness of the condenser; that is to say, it is incorporated in at least one of the walls 6, 9a, 9b, 9c forming the condenser 3.

The dielectric fluid circuit may, notably, be described with reference to FIGS. 9 and 10, which illustrate this circuit schematically in an exploded view.

Notably, the circuit may be formed by deformations that are created, respectively, in one or other of two shells, each of which forms walls when they are assembled together. In this context, and according to an embodiment that is more readily visible in the exploded view of FIG. 10, the walls 6, 9a, 9b, 9c may be formed from three shells 301, 302, 303, notably made of metal and U-shaped, comprising a first shell 301 housing a second shell 302 and a third shell 303, the heat transfer fluid circuit 4 and the dielectric fluid circuit 5 being arranged between the shells 301, 302, 303, notably by the stamping of the latter. The shells 301, 302, 303 are, for example, brazed or welded together. Evidently, in this case, the second shell and third shell are designed so that each delimits a chamber for receiving an electronic component. On the other hand, and following on from the preceding description of the position of the heat transfer fluid circuit in a central area 61, here the dielectric fluid circuit 5 is arranged in the condenser in such a way that this central area formed in the main wall is left free, that is to say by extending on walls of the condenser other than the main wall, and/or by extending on a peripheral area 60 of the main wall.

The first face 11a of the main wall 6 is provided with a dielectric fluid inlet 23 which is arranged near the first lateral end of the main wall 8a. The dielectric fluid inlet 23 allows the dielectric fluid 1 to be admitted into the dielectric fluid circuit 5. The dielectric fluid inlet 23 is in fluid communication with a first dielectric fluid channel 24 running along the first lateral end of the main wall 8a between the dielectric fluid inlet 23 and a first point of circulation of the dielectric fluid 25 which is located directly above the intermediate secondary wall 9c.

More particularly, the first dielectric fluid channel 24 may be formed by a stamped area in the first shell 301 that carries the dielectric fluid inlet and by a flat surface of the second or third shell. The first point of circulation may be formed by two mutually facing stamped areas formed, respectively, in the walls of the second and third shell that contribute to the formation of the intermediate secondary wall.

The first point of circulation of the dielectric fluid 25 is in fluid communication with a second dielectric fluid channel 26 extending inside the intermediate secondary wall 9c to a second point of circulation of the dielectric fluid 27 which is located near the second lateral end of the main wall 8b. The second dielectric fluid channel 26 comprises two first dielectric fluid circulation branches 28 parallel to each other.

The second point of circulation of the dielectric fluid inlet 27 is in fluid communication with a third dielectric fluid channel 29 and a fourth dielectric fluid channel 30 which both extend along the second lateral end of the main wall 8b.

The third dielectric fluid channel 29 extends between the second point of circulation of the dielectric fluid 27 and a fourth point of circulation of the dielectric fluid 31 which is located directly above the first lateral secondary wall 9a.

The fourth point of circulation of the dielectric fluid 31 is in fluid communication with a fifth dielectric fluid channel 33, which extends inside the first lateral secondary wall 9a and which comprises two second dielectric fluid circulation branches 34 parallel to each other. The second dielectric fluid circulation branches 34 extend from the second lateral end of the main wall 8b to the first lateral end of the main wall 8b.

The fourth dielectric fluid channel 30 extends between the second point of circulation of the dielectric fluid 27 and a fifth point of circulation of the dielectric fluid 32 which is located directly above the second lateral secondary wall 9b.

Inside the dielectric fluid circulation channels, the dielectric fluid 1 substantially travels over the second distance D2, enabling the dielectric fluid to be sprayed over the whole of a first dimension, in this case the length, of the electronic components 103. Additionally, since the circulation channels comprise a plurality of dielectric fluid circulation branches, it is possible to spray the dielectric fluid onto different heights of the electronic components, or onto a second dimension of the electronic components parallel to the stacking direction of the levels, thereby providing greater uniformity in the operation of cooling the electronic component concerned.

The fifth point of circulation of the dielectric fluid 32 is in fluid communication with a sixth dielectric fluid channel 35, which extends inside the second lateral secondary wall 9b and which comprises two third dielectric fluid circulation branches 36 parallel to each other. The third dielectric fluid circulation branches 36 extend from the second lateral end of the main wall 8b to the first lateral end of the main wall 8b. Thus, inside the sixth dielectric fluid channel 35, the dielectric fluid 1 substantially travels over the second distance D2.

Each dielectric fluid circulation branch 28, 34, 36 is equipped with a plurality of spray nozzles 37 for spraying the dielectric fluid 1 toward the chamber 10a, 10b, these nozzles contributing to the forming of edges of the secondary walls 9a, 9b, 9c. According to the illustrated example, each dielectric fluid circulation branch 28, 34, 36 is equipped with four spray nozzles 37. The number of spray nozzles 37 provided on a dielectric fluid circulation branch 28, 34, 36 may be different.

It should be noted that the first dielectric fluid circulation branches 28 are provided with a number of spray nozzles 37 that is twice the number of spray nozzles 37 provided on the second dielectric fluid circulation branches 34 and the third dielectric fluid circulation branches 36 respectively, for spraying the dielectric fluid 1 toward the first chamber 10a and toward the second chamber 10b, because the intermediate secondary wall 9c, which is provided with the first dielectric fluid circulation branches 28, borders the two chambers 10a, 10b. Evidently, the spray nozzles 37 provided on the second dielectric fluid circulation branches 34 are designed to spray the dielectric fluid 1 toward the first chamber 10a, and the spray nozzles 37 provided on the third dielectric fluid circulation branches 36 are designed to spray the dielectric fluid 1 toward the second chamber 10b.

According to the variant embodiment described above, the dielectric fluid circuit 5 is formed in the thickness of the main wall 6 of the condenser 3 and in the thickness of the secondary walls 9a, 9b, 9c of the condenser 3.

The description and the corresponding figures, notably FIG. 9, clearly reveal the characteristic according to which the heat transfer fluid circuit 4 is arranged solely in the thickness of the main wall 6, and in a central area 61, whereas the dielectric fluid circuit 5 is configured to leave this central area free and to avoid interference with the action of the condenser on the vaporized dielectric fluid extends. Notably, the dielectric fluid circuit may extend in the thickness of one or other of the secondary walls 9a, 9, 9c, and it may extend along the edge of the main wall, in a peripheral area 60.

The presence of the heat transfer fluid circuit 4 in the main wall 6, and notably in the central area 61 of this wall, makes it feasible for there to be a heat exchange relationship between this first circuit 4 and the dielectric fluid that can come into contact with this main wall 6 after having been heated, and in this case vaporized, by the heat given off by the electronic component 103.

The circuits are also advantageously arranged in the main wall so that the part of the second circuit 5 extending in the peripheral area 60 is very close to a branch of the first circuit 4, thus enabling an exchange of heat from one circuit to the other. Since the proximity of these circuits allows an exchange within the condenser before the outflow or spraying of the dielectric fluid of the second circuit, thermal contact is said to occur between the first and second circuits.

Other embodiments of the temperature regulating device according to the invention will now be described. In these embodiments, as shown in FIGS. 11 to 19, the condenser 3 has no secondary walls, so that it mainly consists of a plate formed by the main wall 6. It should be noted that this is not limiting, and that combinations of the dielectric fluid circuit as described below and of the condenser with secondary walls as described above would be feasible within the context of the invention.

FIGS. 11 and 12 show a temperature regulating device according to a second embodiment, which differs from the preceding embodiment in that the second circuit 5, or dielectric fluid circuit, is entirely contained in the plate, in this case the main wall 6, which also incorporates the first circuit 4, or heat transfer fluid circuit.

As illustrated, the main wall 6 of the condenser 3 is here formed by the junction of two plates with each other, in this case including a stamped plate 62 in which the branches of the first heat transfer fluid circuit and the second dielectric fluid circuit are formed, and a flat plate 64 attached to the stamped plate to seal the branches and form the first and second circuits.

As illustrated, in the plate forming a condenser 3, after the two plates described above have been joined, this second circuit extends in the central area 61 of the plate forming a condenser, and therefore in the area of flow of the heat transfer fluid. In order to allow the coexistence of these two circuits in the same plate, the second circuit 5 is U-shaped and is interwoven with the first circuit.

More particularly, the second circuit comprises a first segment 51 which comprises a first end opening into the dielectric fluid inlet 23, and a second segment 52 parallel to the first segment and extending toward the first lateral end 8*a* of the plate to which the dielectric fluid inlet is attached. The plate and the two circuits are arranged so that different branches of the heat transfer fluid circuit 4 extend between the segments 51, 52, the second segment 52 is sufficiently distant from the first lateral end 8*a* of the plate to allow the passage of a connecting branch of the heat transfer fluid circuit, and the branches connected to the heat transfer fluid inlet 12*a* and the heat transfer fluid outlet 12*b* are arranged on either side of the first segment 51 of the second circuit 5.

As a result of the above arrangements, the second dielectric fluid circuit 5 extends in the plate forming a condenser 3 so as to be surrounded by branches forming part of the first heat transfer fluid circuit, and thermal contact is thus created between the two circuits 4 and 5. As specified above, this thermal contact is advantageous in that it allows the dielectric fluid to undergo subcooling before it is sprayed onto the electronic components 103 whose temperature is to be regulated. In other words, the dielectric fluid circulating in the second fluid exchanges heat with the heat transfer fluid of the first circuit 4 in such a way that its temperature is reduced, before being sprayed onto the electronic components, which are therefore cooled more effectively.

It should be noted that, in this arrangement which is advantageous because of the thermal contact between the circuits that it provides, the heat transfer fluid circulates over by far the largest part of the surface of the plate forming a condenser 3, so that the heat exchange relationship of the first circuit with the fluid sprayed by the second circuit and vaporized by the heat given off by the electronic components continues to be effective.

Another characteristic of this second embodiment is that the dielectric fluid outlets are arranged on opposite faces of the plate forming a condenser 3. More particularly, as shown in FIG. 12, given that each output is here equipped with spray nozzles 37, a first set of spray nozzles 37 is arranged so as to project from the first face 11*a* of the plate forming a condenser 3, and a second set of spray nozzles 37 is arranged so as to project from the second face 11*b*, opposite the first face 11*a* of the plate forming a condenser 3. Thus spray nozzles are arranged on both sides of the plate forming a condenser so that dielectric fluid can be sprayed onto electronic components that may equally well be arranged either above or below the condenser.

FIG. 13 shows a temperature regulating device according to a third embodiment, which differs from that described above for the second embodiment in the arrangement of the two pipes, these pipes again being incorporated in the same plate forming a condenser.

In this third embodiment, the plate forming a condenser 3 of the temperature regulating device 2 has a general shape similar to the main wall 6 described above, but in this case consists of an intermediate wall 200, a cover 212 which is attached to a first face of this intermediate wall, and a plurality of caps 222 which are attached to the second face, opposite the first face, of this intermediate wall. Thus the cover and the caps are fixed on either side of the intermediate wall.

The intermediate wall 200 is stamped so as to have an alternating series of hollows and embossed areas on each of its faces, and, on the opposite face, an alternating series of cavities 211 and recesses 221 extending in parallel along the transverse dimension, from one lateral end 8*a* to the other of the plate forming a condenser 3. Thus the cavities and recesses open on to the first face 11*a* and the second face 11*b* respectively, and at least one plane passes through each of the cavities and each of the recesses.

The cover 212 is arranged to cover the first face 11*a* so as to cover each of the cavities, the cover having an inner face directed toward the first face of the intermediate wall. More particularly, the cover comprises ribs 230 projecting from the inner face and configured to interact with the edges delimiting the cavities 211 of the intermediate wall, so as to provide a seal for the circulation of the fluid present in the cavities.

The caps 222 are positioned in the recesses 221, with a clearance allowing the sealed circulation of fluid between the caps and the intermediate wall in the recesses 221.

It should be noted that, as is evident from FIG. 13, the recesses 221 communicate with each other and contribute to the forming of one of the circuits of the temperature regulating device, in this case the second dielectric fluid circuit 5. The caps 222 and/or the second face 11*b* of the intermediate wall at the recesses 221 comprise dielectric fluid outlets, not visible here on the section plane, to enable the fluid to be sprayed toward electronic components.

Similarly, the cavities 211 progressively communicate, and contribute to the forming of one of the circuits of the temperature regulating device, in this case the first heat transfer fluid circuit 4. A heat transfer fluid inlet and outlet are arranged on an edge of the intermediate wall to allow the circulation of heat transfer fluid in this first circuit 4.

A description will now be given of a fourth embodiment, with reference to FIGS. 14 to 17, which differs from the preceding embodiment in that the second dielectric fluid circuit 5 is formed by a pipe 400, or tube, made separately from the plate forming a condenser. In other words, the second circuit is not incorporated into the plate forming a condenser.

As illustrated, the condenser is here formed by the junction of two plates with each other, in this case including a stamped plate 402 in which the branches of the first heat transfer fluid circuit are made, and a flat plate 404 attached to the stamped plate to seal the branches and form the first circuit.

The pipe 400 forming the second circuit, that is to say the pipe, tubular in this case, in which the dielectric fluid can circulate, is attached to the second face 11*b* of the condenser 3, here formed by a face of the flat plate 404, which is turned toward a chamber for receiving at least one electronic component. This pipe is more particularly visible in FIG. 15 or FIG. 16.

The pipe 400, here present in the form of a tube 40 of circular cross section, may be made from a different material from that used to make the plate forming a condenser 3, and it may, notably, be made of aluminum.

The pipe forming the second circuit has, in this fourth embodiment, a substantially flat shape, and it is arranged in a plane parallel to the plate forming a condenser 3. In FIG. 14, the tube 40 forming the pipe 400 is transparently visible under the main wall 6 of the plate forming a condenser 3.

The dielectric fluid 1 is sprayed from the fluid outlets of the second circuit 5, opposed to the plate forming a condenser 3 incorporating the first circuit 4. These outlets may be equipped with spray nozzles 37, which may be directed to spray the dielectric fluid onto one or other of the sides of the electronic components 103 whose temperature is to be regulated. According to the above description, the first circuit 4 is in a heat exchange relationship with the dielectric fluid leaving the second circuit 5 and vaporized by the heat given off by the electronic components, in the sense that the first circuit exchanges heat with the vapor coming into contact with the plate forming a condenser.

The temperature regulating device 2 comprises dielectric fluid inlet end 23 fixed to the pipe forming the second circuit, together with a heat transfer fluid inlet and outlet connected to the heat transfer fluid circuit. In this fourth embodiment, the dielectric fluid inlet end 23 arranged at a free end of the pipe contributing to the forming of the second circuit is fixed to the plates forming a condenser 3.

More particularly, the dielectric fluid inlet end 23 is fitted into an opening 406 arranged in the condenser, in this case in the flat plate forming the condenser, and notably at the position of a lateral protuberance 408, so that as may be seen in FIG. 14, this protuberance and the dielectric fluid inlet end passing through it extend laterally beyond the stamped plate forming the condenser.

The condenser incorporating the first circuit and the pipe, tubular in this case, delimiting the second circuit thus form an interdependent assembly, which can subsequently be added to the system of electronic components. To ensure the one-piece nature of the temperature regulating device comprising the two circuits, or in other words to ensure that the two elements forming this temperature regulating device cannot be separated without the breakage of one or the other; a brazing operation may be executed to ensure that the dielectric fluid inlet end is secured to the condenser.

It should be noted that the low weight of the pipe, tubular in this case, creates no stresses at the brazed joint, and, when the temperature regulating device is handled, the tubular pipe 400 forming the second circuit remains at a constant distance from the condenser, preferably against the corresponding face of the condenser. The second circuit 5 is thus sufficiently near the first circuit, notably at a distance of less than 10 mm, for the two circuits 4, 5 to be considered as being in thermal contact with each other, according to the description above. Here again, the temperature regulating device 2 is also arranged in a temperature regulating assembly, notably facing electronic components 103, so that the first circuit, or heat transfer fluid circuit 4, is in a heat exchange relationship with the dielectric fluid sprayed from the pipe 400, here in the form of a tube 40, toward the electronic components and vaporized by the heat given off by these components when they are in operation.

In the example illustrated in FIG. 15, fixing studs 410 are also provided, and are arranged between the pipe 400 delimiting the second dielectric fluid circuit 5 and the plate forming a condenser 3. The main dimension of these fixing studs then defines the spacing between the first circuit 4 and the second circuit 5, the latter not being directly pressed against the plate forming a condenser 3 and incorporating the first circuit 4.

Preferably, the main dimension of the fixing studs 410 is less than 10 mm, to ensure that the circuits are close together.

As a result of the above arrangement, as described above, the temperature regulating device according to the fourth embodiment is configured so that there is thermal contact between the circuits. If fixing studs are present, they are made of a material capable of conducting heat from one circuit to the other, and are designed so that a minimum distance is provided between the two circuits, as a result of which it may be considered that there is the equivalent of thermal contact between the two, as mentioned above.

In this fourth embodiment, the tube 40 forming the pipe 400 for the dielectric fluid is arranged in a flat zigzag comprising first portions of tube 40a parallel to the longitudinal ends of the main wall 7a, 7b and second portions of tube 40b running along the lateral ends of the main wall 8a, 8b, at least a first portion of tube 40a being interposed between two second portions of tube 40b, and at least a second portion of tube 40b being interposed between two first portions of tube 40a.

It may be noted in FIG. 16 that the second portions of tube 40b are alternatively arranged near the first lateral end of the main wall 8a and the second lateral end of the main wall 8b.

FIG. 17 shows a variant of the fourth embodiment of the temperature regulating device, which differs from that described immediately above in that the second portions of tube 40b are arranged near the first lateral end of the main wall 8a, the second dielectric fluid circuit being in the shape of a comb, with the first portions of tube 40a forming teeth parallel to each other.

This variant is also different in that the pipe is formed by a flat tube, that is to say a tube with a rectangular cross section, different from the circular cross section described above, and in that this pipe is arranged against the plate forming a condenser in grooves provided for this purpose. During the brazing operation in which the circuits are fixed together to form a one-piece assembly, the arrangement of the tube in the bottom of the groove ensures the attachment of the tube and thus improves the thermal contact of one circuit with the other.

FIG. 18 shows a fifth embodiment in which the pipe 400 of the second circuit is formed by a bent tube comprising lateral portions 420 that can run along the lateral faces of the electronic components 103.

In this context, the tube comprises lateral portions that extend substantially perpendicularly to the plane in which the plate forming a condenser extends. In this fifth embodiment, the temperature regulating device 2 is here equipped with two dielectric fluid circuits 5, which extend at a distance from the second face 11b of the main wall 6, opposite the first face 11a. Each dielectric fluid circuit 5 is, for example, made from a tube 40 extending partially in two tube planes P1, P2. Thus, each dielectric fluid circuit 5 comprises at least a first portion of circuit 41 extending in a first plane P1 and a second portion de circuit 42 extending in a second plane P2, the first plane P1 being interposed between the main wall 6 and the second plane P2, the distances provided between the main wall 6 and the first plane P1 on the one hand, and between the first plane P1 and the second plane P2 on the other hand, being non-zero. The first portion of circuit 41 and the second portion of circuit 42 of the same dielectric fluid circuit 5 are connected to each other via at least a third portion of circuit 43 extending along an axis orthogonal to the first plane P1 and to the second plane P2. Mechanical reinforcers 44 extend between the first portion of circuit 41 and the second portion of circuit 42 of the same dielectric fluid circuit 5, to impart robustness to each dielectric fluid circuit 5. These arrangements are such that each tube 40 is arranged in a zigzag extending in a volume bordered at least by the main plate 6 and the second plane P2. The tube 40 is provided with a plurality of spray nozzles 37 directed toward the first chamber 10*a* or the second chamber 10*b*, which are at least partially delimited by an intermediate arrangement 45 of an element of a first portion of circuit 41 and an element of a second portion of circuit 42 superimposed on each other, the intermediate arrangement 45 being interposed between two respective lateral arrangements 46 of an element of a first portion of circuit 41 and an element of a second portion de circuit 42 superimposed on each other, these lateral arrangements forming said lateral portions 420 of the bent tube.

FIG. 19 shows a sixth embodiment in which the first circuit, that is to say the heat transfer fluid circuit, differs from that described above and is no longer contained within the thickness of a solid plate against or in which the second circuit is attached.

More particularly, the first circuit is here formed by means of a tube exchanger, with a plurality of tubes arranged parallel to each other between two manifolds for the inflow and outflow of heat transfer fluid, the tubes of the exchanger being spaced apart from each other.

The pipe delimiting the second circuit is here identical to that described and illustrated for the fourth embodiment. As described above, the second circuit is fixed, by a welding, brazing or bonding operation for example, to the exchanger forming the first circuit, so that the circuits are in thermal contact with each other, the first circuit being in a heat exchange relationship with the fluid leaving the second circuit.

FIG. 20 shows different arrangements of a temperature regulating assembly, comprising a temperature regulating device associated with two electronic components whose temperature is to be regulated by spraying dielectric fluid.

FIGS. 20*a* to 20*f* show a condenser similar to that described above for the first embodiment, and FIGS. 20*g* and 20*h* show a condenser similar to that described above for the fourth embodiment, for example, although the type of condenser is not a limiting factor in the choice of any particular arrangement.

Notably, FIG. 20*a* clearly shows a device in which the first heat transfer fluid circuit is advantageously arranged in the main wall 6, above the electronic components, and in which the second dielectric fluid circuit, and at least the spray nozzles 37, are arranged laterally to these components, in this case in the secondary walls 9*a*, 9*b*, 9*c*. The two circuits are arranged relative to each other in such a way that the first circuit is at least in a heat exchange relationship with the fluid leaving the second circuit and evaporated by the heat given off by the electronic components. If necessary, the second circuit is placed near enough to the first circuit for the two circuits to be considered to be in thermal contact, and for the subcooling of the dielectric fluid to be possible on its outflow from the second circuit. When the temperature regulating assembly is installed in the vehicle, the main wall forming a condenser is arranged above the electronic components. A recovery tank common to the two electronic components is provided under these components.

Figure 20B:
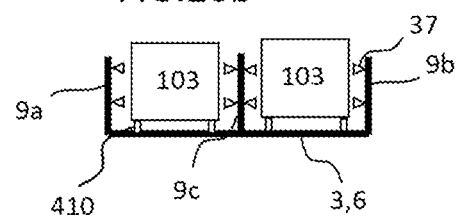

FIG. 20*b* shows an inverted arrangement, in which the main wall forming a condenser is placed below the electronic components. Here again, the second dielectric fluid circuit, and at least the spray nozzles 37, are arranged laterally to these components, in this case in the secondary walls 9*a*, 9*b*, 9*c*. The two circuits are arranged relative to each other in such a way that the first circuit is at least in a heat exchange relationship with the part of the fluid leaving the second circuit and flowing by gravity along the electronic components. If necessary, the second circuit is placed near enough to the first circuit for the two circuits to be considered to be in thermal contact, and for subcooling of the dielectric fluid to be possible on its outflow from the second circuit. In this configuration, it may be unnecessary to provide a tank, since the recovery may take place along the main wall 6. Fixing studs 420 are here installed between the main wall and the electronic components.

Figure 20C:
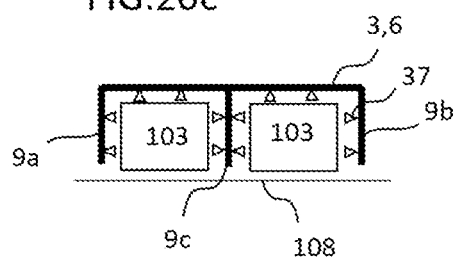
Figure 20D:
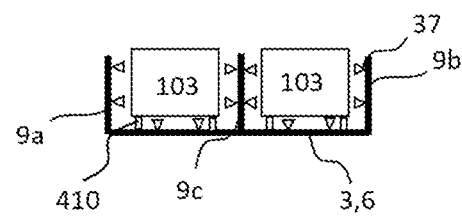

FIGS. 20*c* and 20*d* show arrangement similar to those of FIGS. 20*a* and 20*b* respectively, with an additional dielectric fluid spraying area, namely an area comprised in the main wall 6 where the first heat transfer fluid circuit extends.

Figure 20E:
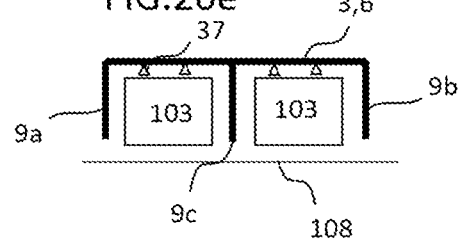
Figure 20F:
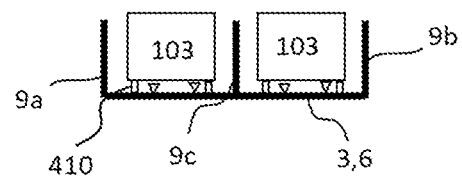

FIGS. 20*e* and 20*f* show arrangements that differ from the above in that the heat transfer fluid here circulates only in the secondary walls, laterally to the electronic components, while the dielectric fluid and the corresponding spray nozzles are placed above or below the electronic component whose temperature is to be regulated.

Figure 20G:
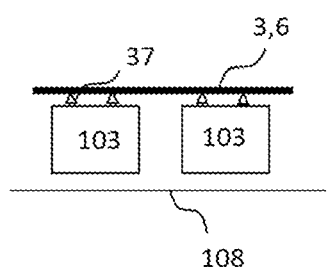
Figure 20H:
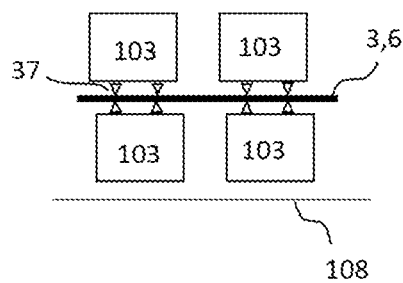

FIGS. 20*g* and 20*h* show arrangements that were mentioned in the description of the third embodiment, with the spray nozzles 37 placed on either side of the main wall 6 of the condenser. FIG. 20*g* shows an arrangement in which all the nozzles are directed in the same direction, and at least all in the direction of the electrical component(s) whose temperature is to be regulated, and which are covered by the condenser. FIG. 20*h* shows an arrangement in which the nozzles are, here, arranged at equal intervals, although this does not limit the invention, on either side of the plate forming a condenser, a first set of the spray nozzles facing first electronic components placed under the plate forming a condenser and a second set of the spray nozzles facing second electronic components placed under the plate forming a condenser.

The invention claimed is:

1. A device for regulating the temperature of, and for cooling, an electrical component whose temperature has to be regulated, said electrical component being capable of giving off heat during its operation, the temperature regulating device comprising:
 a first circuit configured for allowing the circulation of a heat transfer fluid;
 a second circuit configured to convey a dielectric fluid, the second circuit comprising at least one outlet for distributing the dielectric fluid toward the electrical component;
 the first circuit and the second circuit being arranged so that the first circuit is in a heat exchange relationship with the fluid distributed via the at least one outlet of the second circuit; and
 a plate incorporating the first circuit so as to form a condenser capable of liquefying the fluid distributed by the at least one outlet of the second circuit,
 wherein the second circuit is incorporated into the plate incorporating the first circuit, and
 wherein the first circuit and the second circuit are arranged on either side of the plate forming a condenser, which has a plurality of cavities on one side and a plurality of recesses on the other side, said cavities and recesses being covered, respectively, by at least one cover and at least one cap, so that the cavities and recesses form the first and second circuit, respectively.

2. The temperature regulating device as claimed in claim 1, wherein the second circuit extends in the plate forming a condenser so as to be surrounded by branches forming part of the first circuit.

3. The temperature regulating device as claimed in claim 1, wherein the second circuit is arranged in a peripheral area of the plate forming a condenser, so as to leave a central area of this plate free for the heat transfer fluid circuit.

4. The temperature regulating device as claimed in claim 1, wherein the second circuit is incorporated into a plate secant to the plate incorporating the first circuit.

5. The temperature regulating device as claimed in claim 1, wherein at least the plate forming a condenser is formed from two separate shells, placed against one another, at least one shell having an embossed area that delimits a cavity forming part of the heat transfer fluid circuit and/or part of the dielectric fluid circuit.

6. The temperature regulating device as claimed in claim 1, wherein the condenser comprises at least one main wall provided with the dielectric fluid inlet and with a heat transfer fluid inlet and heat transfer fluid outlet, between which the heat transfer fluid circuit extends, the condenser further comprising a plurality of secondary walls forming a projection from the main wall, including a first secondary wall provided on a first longitudinal end of the main wall, a second, lateral, secondary wall provided on a second longitudinal end of the main wall, and an intermediate secondary wall which is interposed between the lateral secondary walls, the intermediate secondary wall, together with part of the main wall and one of the lateral secondary walls, contributing to delimiting two receiving chambers for an electrical component.

7. The temperature regulating device as claimed in claim 6, wherein the first circuit is formed in at least the main wall.

8. The temperature regulating device as claimed in claim 1, wherein the second circuit is formed in at least one secondary wall.

9. The temperature regulating device as claimed in claim 1, wherein each distribution outlet of the dielectric fluid circuit comprises a spray nozzle, each spray nozzle being directed toward a battery element.

10. The temperature regulating device as claimed in claim 9, wherein spray nozzles are arranged on opposite faces of the plate forming a condenser.

11. The temperature regulating device as claimed in claim 1, wherein the second circuit is formed by a pipe constructed separately from the plate forming a condenser and attached to a face of this plate which is turned towards a chamber for receiving at least one electrical component.

12. The temperature regulating device as claimed in claim 11, wherein the pipe forming the second circuit has a dielectric fluid inlet end that is fixed to the plate forming a condenser by a brazing operation.

13. The temperature regulating device as claimed in claim 11, wherein the pipe forming the second circuit is fixed to the plate forming a condenser by fixing studs.

14. The temperature regulating device as claimed in claim 11, wherein the pipe forming the second circuit is substantially flat in shape, and is arranged in a plane parallel to the plate forming a condenser.

15. The temperature regulating device as claimed in claim 11, wherein the pipe forming the second circuit has bent portions extending in a plane substantially perpendicular to the plane of the plate forming a condenser.

16. The temperature regulating device as claimed in claim 1, wherein the first circuit and second circuit are, respectively, formed by a pipe arranged in the vicinity of the corresponding electrical component.

17. A temperature regulating assembly comprising:
a temperature regulating device as claimed in claim 1 and configured for regulating the temperature of a plurality of electrical components stacked in a stacking direction, at least one of the electrical components being associated with the at least one first circuit and the at least one second circuit,
wherein said regulating device comprises a tank for the recovery of the dielectric fluid, arranged in the prolongation of the electrical components in the stacking direction and configured for receiving the dielectric fluid from each condenser,
the temperature regulating device comprising means for recirculating the dielectric fluid which are provided with a pump and which connect the recovery tank to the at least one dielectric fluid inlet comprised in each of the second circuits.

18. A device for regulating the temperature of, and for cooling, an electrical component whose temperature has to be regulated, said electrical component being capable of giving off heat during its operation, the temperature regulating device comprising:
a first circuit configured for allowing the circulation of a heat transfer fluid;
a second circuit configured to convey a dielectric fluid, the second circuit comprising at least one outlet for distributing the dielectric fluid toward the electrical component; and
the first circuit and the second circuit being arranged so that the first circuit is in a heat exchange relationship with the fluid distributed via the at least one outlet of the second circuit,
a plate incorporating the first circuit so as to form a condenser capable of liquefying the fluid distributed by the at least one outlet of the second circuit,
the second circuit is incorporated into a plate secant to the plate incorporating the first circuit.

19. A device for regulating the temperature of, and for cooling, an electrical component whose temperature has to be regulated, said electrical component being capable of giving off heat during its operation, the temperature regulating device comprising:
a first circuit configured for allowing the circulation of a heat transfer fluid;
a second circuit configured to convey a dielectric fluid, the second circuit comprising at least one outlet for distributing the dielectric fluid toward the electrical component;
the first circuit and the second circuit being arranged so that the first circuit is in a heat exchange relationship with the fluid distributed via the at least one outlet of the second circuit,
wherein at least the plate forming a condenser is formed from two separate shells, placed against one another, at least one shell having an embossed area that delimits a cavity forming part of the heat transfer fluid circuit and/or part of the dielectric fluid circuit.

* * * * *